United States Patent
Fukuda et al.

(10) Patent No.: US 11,133,430 B2
(45) Date of Patent: Sep. 28, 2021

(54) PHOTOELECTRIC CONVERSION ELEMENT PRODUCTION METHOD

(71) Applicant: KANEKA CORPORATION, Osaka (JP)

(72) Inventors: Masanori Fukuda, Toyooka (JP); Toshifumi Namiuchi, Toyooka (JP); Takahiro Matsuda, Toyooka (JP)

(73) Assignee: KANEKA CORPORATION, Osaka (JP)

( * ) Notice: Subject to any disclaimer, the term of this patent is extended or adjusted under 35 U.S.C. 154(b) by 47 days.

(21) Appl. No.: 16/638,056

(22) PCT Filed: May 29, 2018

(86) PCT No.: PCT/JP2018/020598
§ 371 (c)(1),
(2) Date: Feb. 10, 2020

(87) PCT Pub. No.: WO2019/031029
PCT Pub. Date: Feb. 14, 2019

(65) Prior Publication Data
US 2020/0176629 A1 Jun. 4, 2020

(30) Foreign Application Priority Data

Aug. 9, 2017 (JP) .............................. JP2017-154434
Aug. 9, 2017 (JP) .............................. JP2017-154435
Aug. 9, 2017 (JP) .............................. JP2017-154436

(51) Int. Cl.
*H01L 31/18* (2006.01)
*H01L 31/046* (2014.01)

(52) U.S. Cl.
CPC .......... *H01L 31/182* (2013.01); *H01L 31/046* (2014.12)

(58) Field of Classification Search
None
See application file for complete search history.

(56) References Cited

U.S. PATENT DOCUMENTS 6,461,444 B1 * 10/2002 Nishio .................... C23C 16/54
134/29
2013/0269602 A1 * 10/2013 Miyamoto ............ H01L 31/186
118/66

(Continued)

FOREIGN PATENT DOCUMENTS

JP 9-106952 A 4/1997
JP 2001-126992 A 5/2001

(Continued)

OTHER PUBLICATIONS

International Search Report dated Jun. 26, 2018 for corresponding international application No. PCT/JP2018/020598.

*Primary Examiner* — Benjamin P Sandvik
(74) *Attorney, Agent, or Firm* — Hauptman Ham, LLP

(57) ABSTRACT

A method of manufacturing a photoelectric conversion element according to the present disclosure includes: a first placement step in which a first semiconductor substrate on which a first thin film and a second thin film are not formed is placed in a first film forming place (81) in a first film forming chamber (61); a second placement step in which a second semiconductor substrate on which the first thin film is formed on a first-principal-surface side and the second thin film is not formed on a second-principal-surface side is placed in a second film forming place (82) in the chamber (61); and a first film forming step in which forming of the first thin film on the first-principal-surface side of the first semiconductor substrate and forming of the second thin film on the second-principal-surface side of the second semiconductor substrate are executed in the same period in the chamber (61).

33 Claims, 8 Drawing Sheets

(56) References Cited

U.S. PATENT DOCUMENTS

2013/0280844 A1\* 10/2013 Miyamoto .......... H01L 31/0322
　　　　　　　　　　　　　　　　　　　438/57
2016/0300975 A1\* 10/2016 Heng .................. H01L 31/0747
2021/0119067 A1\* 4/2021 Fukuda ........... H01L 31/022425

FOREIGN PATENT DOCUMENTS

| JP | 2009-164426 A | 7/2009 |
|----|---------------|--------|
| JP | 2010-34162 A | 2/2010 |
| JP | 2013-72132 A | 4/2013 |
| JP | 2013-118351 A | 6/2013 |
| JP | 2015-192077 A | 11/2015 |
| WO | 2011/125861 A1 | 10/2011 |
| WO | 2014/050304 A1 | 4/2014 |

\* cited by examiner

PHOTOELECTRIC CONVERSION ELEMENT PRODUCTION METHOD

CROSS REFERENCE TO RELATED APPLICATION

This application claims the priority of Japanese Patent Application No. 2017-154434, No. 2017-154435, and No. 2017-154436 filed on Aug. 9, 2017, in the JPO (Japanese Patent Office). Further, this application is the National Phase Application of International Application No. PCT/JP2018/020598, filed on May 29, 2018, which designates the United States and was published in Japan. Both of the priority documents are hereby incorporated by reference in their entireties.

TECHNICAL FIELD

The present invention relates to a method of manufacturing a photoelectric conversion element.

BACKGROUND ART

In Patent Literature 1 provided below, there is disclosed a method of manufacturing a solar battery, the method including the steps of: forming a first intrinsic amorphous silicon layer on the front side of a semiconductor substrate in a first film forming chamber; forming a p-type amorphous silicon layer on the front side of the first intrinsic amorphous silicon layer in a second film forming chamber; moving the semiconductor substrate in a direction perpendicular to a front surface of the semiconductor substrate in a movement chamber, to thereby expose the back side of the semiconductor substrate; forming a second intrinsic amorphous silicon layer on the back side of the semiconductor substrate in a third film forming chamber; and forming an n-type amorphous silicon layer on the back side of the second intrinsic amorphous silicon layer in a fourth film forming chamber. The first film forming chamber, the second film forming chamber, the movement chamber, the third film forming chamber, and the fourth film forming chamber are connected in series to form a so called inline film forming apparatus.

In Patent Literature 2 provided below, there is disclosed a method including forming a p-type amorphous silicon layer on the entire surface of a substrate tray, on which a semiconductor substrate has been mounted, and then forming an intrinsic amorphous silicon layer on a top surface of the substrate tray, on which the p-type amorphous silicon layer has been formed. With this manufacturing method, when the above-mentioned substrate tray is used to form an intrinsic amorphous silicon layer on the semiconductor substrate mounted on the substrate tray, impurities added to the p-type amorphous silicon layer and adhering to the substrate tray can be prevented from mixing into the intrinsic amorphous silicon layer.

CITATION LIST

Patent Literature

[PTL 1] JP 2013-118351 A
[PTL 2] JP 2010-34162 A

SUMMARY OF INVENTION

Technical Problem

The manufacturing method described in Patent Literature 1 described above has a problem in that the downsizing of the film forming apparatus is difficult. That is, in the manufacturing method of the related art described above, the first film forming chamber for forming a given thin film on the first-principal-surface side of the semiconductor substrate and the third film forming chamber for forming a thin film on the second-principal-surface side of the semiconductor substrate from the same material as that of the given thin film are required to be separate from each other in order to achieve an inline manufacturing process, which presents a difficulty in downsizing the film forming apparatus.

In the manufacturing method described in Patent Literature 2 described above, an intrinsic amorphous silicon layer is required to be formed on the substrate tray each time a semiconductor layer of the other conductivity type is formed with the use of the above-mentioned substrate tray, which presents a difficulty in improving the manufacturing efficiency.

The present invention has been made in view of the problems described above, and a first object of the present invention is to realize an inline manufacturing process that uses a downsized film forming apparatus to manufacture a photoelectric conversion element.

A second object of the present invention is to accomplish improvement in manufacturing efficiency.

Solution to Problem (1) According to a first aspect of the present invention, there is provided a method of manufacturing a photoelectric conversion element, the photoelectric conversion element having a first principal surface and a second principal surface, and including at least a first thin film, a semiconductor substrate, and a second thin film in this order, the method including a first placement step, a second placement step, and a first film forming step. In the first placement step, a first semiconductor substrate on which the first thin film and the second thin film are not formed is placed in a first film forming place in a first film forming chamber. In the second placement step, a second semiconductor substrate on which at least the first thin film is formed on the first-principal-surface side and the second thin film is not formed on the second-principal-surface side is placed in a second film forming place in the first film forming chamber. In the first film forming step, a step of forming the first thin film on the first-principal-surface side of the first semiconductor substrate and a step of forming the second thin film on the second-principal-surface side of the second semiconductor substrate are executed in the same period in the first film forming chamber.

(2) In the method of manufacturing a photoelectric conversion element according to Item (1), the first thin film and the second thin film may have a common composition.

(3) In the method of manufacturing a photoelectric conversion element according to Item (1) or (2), the first thin film and the second thin film may be formed by using a common raw material gas.

(4) In the method of manufacturing a photoelectric conversion element according to any one of Items (1) to (3), in the first film forming step, a film forming condition under which the first thin film is formed in the first film forming place and a film forming condition under which the second thin film is formed in the second film forming place may differ from each other.

(5) The method of manufacturing a photoelectric conversion element according to anyone of Items (1) to (4) may further include an inversion step and a transportation step. In the inversion step, the first-principal-surface side and the second-principal-surface side may be inverted in the first semiconductor substrate that has undergone the first film forming step. In the transportation step, the first semiconductor substrate that has undergone the first film forming step may be carried into the first film forming chamber as the second semiconductor substrate.

(6) In the method of manufacturing a photoelectric conversion element according to any one of Items (1) to (5), the first thin film and the second thin film that are formed in the first film forming step may be intrinsic semiconductor layers.

(7) In the method of manufacturing a photoelectric conversion element according to any one of Items (1) to (6), the first film forming chamber may include a first cathode, a second cathode, and a first anode, the first anode being placed between the first cathode and the second cathode. In the first placement step, the first semiconductor substrate may be placed in the first film forming place so that the first-principal-surface side of the first semiconductor substrate faces the first cathode. In the second placement step, the second semiconductor substrate may be placed in the second film forming place so that the second-principal-surface side of the second semiconductor substrate faces the second cathode. In the first film forming step, plasma discharge may be caused in the first film forming place and the second film forming place.

(8) In the method of manufacturing a photoelectric conversion element according to any one of Items (1) to (7), the first placement step and the second placement step may be executed substantially concurrently.

(9) The method of manufacturing a photoelectric conversion element according to any one of Items (1) to (8) may further include a third placement step, a fourth placement step, and a second film forming step. In the third placement step, in a second film forming chamber connected in series to the first film forming chamber, the first semiconductor substrate may be placed in a third film forming place in the second film forming chamber. In the fourth placement step, in the second film forming chamber, the second semiconductor substrate may be placed in a fourth film forming place in the second film forming chamber. In the second film forming step, in the second film forming chamber, no first-conductivity-type semiconductor layer may be formed on the second-principal-surface side of the second thin film on the second semiconductor substrate, and the first-conductivity-type semiconductor layer may be formed on the first-principal-surface side of the first thin film on the first semiconductor substrate.

(10) In the method of manufacturing a photoelectric conversion element according to Item (9), the second film forming chamber may include a third cathode, a fourth cathode, and a second anode, the second anode being placed between the third cathode and the fourth cathode. In the third placement step, the first semiconductor substrate may be placed in the third film forming place so that the first-principal-surface side of the first semiconductor substrate faces the third cathode. In the fourth placement step, the second semiconductor substrate may be placed in the fourth film forming place so that the second-principal-surface side of the second semiconductor substrate faces the fourth cathode. In the second film forming step, plasma discharge may be caused in the third film forming place.

(11) In the method of manufacturing a photoelectric conversion element according to Item (10), in the second film forming step, a raw material gas used to form the first-conductivity-type semiconductor layer may not be supplied in the fourth film forming place.

(12) In the method of manufacturing a photoelectric conversion element according to any one of Items (9) to (11), the third placement step and the fourth placement step may be executed substantially concurrently.

(13) The method of manufacturing a photoelectric conversion element according to any one of Items (9) to (12) may further include a fifth placement step, a sixth placement step, and a third film forming step. In the fifth placement step, in a third film forming chamber connected in series to the second film forming chamber, the first semiconductor substrate may be placed in a fifth film forming place in the third film forming chamber. In the sixth placement step, in the third film forming chamber, the second semiconductor substrate may be placed in a sixth film forming place in the third film forming chamber. In the third film forming step, in the third film forming chamber, no second-conductivity-type semiconductor layer may be formed on the first-principal-surface side of the first-conductivity-type semiconductor layer on the first semiconductor substrate, and the second-conductivity-type semiconductor layer may be formed on the second-principal-surface side of the second thin film on the second semiconductor substrate.

(14) In the method of manufacturing a photoelectric conversion element according to Item (13), the third film forming chamber may include a fifth cathode, a sixth cathode, and a third anode, the third anode being placed between the fifth cathode and the sixth cathode. In the fifth placement step, the first semiconductor substrate may be placed in the fifth film forming place so that the first-principal-surface side of the first semiconductor substrate faces the fifth cathode. In the sixth placement step, the second semiconductor substrate may be placed in the sixth film forming place so that the second-principal-surface side of the second semiconductor substrate faces the sixth cathode. In the third film forming step, plasma discharge may be caused in the sixth film forming place.

(15) In the method of manufacturing a photoelectric conversion element according to Item (14), in the third film forming step, a raw material gas used to form the second-conductivity-type semiconductor layer may not be supplied in the fifth film forming place.

(16) In the method of manufacturing a photoelectric conversion element according to any one of Items (13) to (15), the fifth placement step and the sixth placement step may be executed substantially concurrently.

(17) The method of manufacturing a photoelectric conversion element according to anyone of Items (1) to (8) may further include a third placement step, a fourth placement step, and a second film forming step. In the third placement step, in a second film forming chamber connected in series to the first film forming chamber, the first semiconductor substrate may be placed in a third film forming place in the second film forming chamber. In the fourth placement step, in the second film forming chamber, the second semiconductor substrate may be placed in a fourth film forming place in the second film forming chamber. In the second film forming step, in the second film forming chamber, no second-conductivity-type semiconductor layer may be formed on the first-principal-surface side of the first thin film on the first semiconductor substrate, and the second-conductivity-type semiconductor layer may be formed on the second-principal-surface side of the second thin film on the second semiconductor substrate.

(18) The method of manufacturing a photoelectric conversion element according to Item (17) may further include a fifth placement step, a sixth placement step, and a third film forming step. In the fifth placement step, in a third film forming chamber connected in series to the second film forming chamber, the first semiconductor substrate may be placed in a fifth film forming place in the third film forming chamber. In the sixth placement step, in the third film forming chamber, the second semiconductor substrate may be placed in a sixth film forming place in the third film forming chamber. In the third film forming step, in the third film forming chamber, no first-conductivity-type semiconductor layer may be formed on the second-principal-surface side of the second-conductivity-type semiconductor layer on the second semiconductor substrate, and the first-conductivity-type semiconductor layer may be formed on the first-principal-surface side of the first thin film on the first semiconductor substrate.

(19) The method of manufacturing a photoelectric conversion element according to any one of Items (13) to (16) and (18) may further include a fourth film forming step. In the fourth film forming step, in a fourth film forming chamber connected in series to the third film forming chamber, a first transparent conductive layer may be formed on the first-principal-surface side of the first-conductivity-type semiconductor layer on the first semiconductor substrate, and a second transparent conductive layer may be formed on the second-principal-surface side of the second-conductivity-type semiconductor layer on the second semiconductor substrate.

(20) The method of manufacturing a photoelectric conversion element according to Item (19) may further include a fifth film forming step. In the fifth film forming step, in a fifth film forming chamber connected in series to the fourth film forming chamber, a first insulating film may be formed on the first-principal-surface side of the first transparent conductive layer on the first semiconductor substrate, and a second insulating film may be formed on the second-principal-surface side of the second transparent conductive layer on the second semiconductor substrate.

(21) In the method of manufacturing a photoelectric conversion element according to any one of Items (1) to (20), the second semiconductor substrate may be the first semiconductor substrate on which the first thin film has been formed in the first film forming step.

(22) According to a second aspect of the present invention, there is provided a method of manufacturing a photoelectric conversion element, the photoelectric conversion element having a first principal surface and a second principal surface, and including at least a first-conductivity-type semiconductor layer, a first intrinsic semiconductor layer, a semiconductor substrate, a second intrinsic semiconductor layer, and a second-conductivity-type semiconductor layer in this order, the method using an inline film forming apparatus in which a plurality of film forming chambers are connected in series, and including the steps of: forming the first intrinsic semiconductor layer; forming the first-conductivity-type semiconductor layer; forming the second intrinsic semiconductor layer; and forming the second-conductivity-type semiconductor layer, the inline film forming apparatus including a first film forming chamber, a second film forming chamber, and a third film forming chamber in this order. In the step of forming the first intrinsic semiconductor layer, the first intrinsic semiconductor layer is formed on the first-principal-surface side of the semiconductor substrate in the first film forming chamber. In the step of forming the first-conductivity-type semiconductor layer, the first-conductivity-type semiconductor layer is formed on the first-principal-surface side of the first intrinsic semiconductor layer in the second film forming chamber. In the step of forming the second intrinsic semiconductor layer, the second intrinsic semiconductor layer is formed on the second-principal-surface side of the semiconductor substrate in the first film forming chamber. In the step of forming the second-conductivity-type semiconductor layer, the second-conductivity-type semiconductor layer is formed on the second-principal-surface side of the second intrinsic semiconductor layer in the third film forming chamber.

(23) The method of manufacturing a photoelectric conversion element according to Item (22) may further include: a step of passing through the third film forming chamber, in which the semiconductor substrate passes through the third film forming chamber, and which is executed after the step of forming the first-conductivity-type semiconductor layer; and a step of passing through the second film forming chamber, in which the semiconductor substrate passes through the second film forming chamber, and which is executed after the step of forming the second intrinsic semiconductor layer.

(24) In the method of manufacturing a photoelectric conversion element according to Item (23), the step of forming the second intrinsic semiconductor layer may be a step that follows the step of passing through the third film forming chamber. The method may further include: a transportation step, in which the semiconductor substrate is carried into the first film forming chamber; and an exposure step, in which the second-principal-surface side of the semiconductor substrate is exposed, the transportation step and the exposure step being executed in a time window that follows the step of passing through the third film forming chamber and that precedes the step of forming the second intrinsic semiconductor layer.

(25) In the method of manufacturing a photoelectric conversion element according to Item (23), the step of forming the first intrinsic semiconductor layer may be a step that follows the step of forming the second-conductivity-type semiconductor layer. The method may further include: a transportation step, in which the semiconductor substrate is carried into the first film forming chamber; and an exposure step, in which the first-principal-surface side of the semiconductor substrate is exposed, the transportation step and the exposure step being executed in a time window that follows the step of forming the second-conductivity-type semiconductor layer and that precedes the step of forming the first intrinsic semiconductor layer.

(26) In the method of manufacturing a photoelectric conversion element according to Item (23), the second film forming chamber may include a cathode connected to a high-frequency power source, and an anode placed so as to face the cathode. In the step of passing through the second film forming chamber, the semiconductor substrate may be placed between the cathode and the anode so that the second-principal-surface side of the semiconductor substrate faces the cathode, and the high-frequency power source may be turned off.

(27) In the method of manufacturing a photoelectric conversion element according to Item (23), the third film forming chamber may include a cathode connected to a high-frequency power source, and an anode placed so as to face the cathode. In the step of passing through the third film forming chamber, the semiconductor substrate may be placed between the cathode and the anode so that the first-principal-surface side of the semiconductor substrate faces the cathode, and the high-frequency power source may be turned off.

(28) In the method of manufacturing a photoelectric conversion element according to any one of Items (22) to (27), the first film forming chamber may include a first cathode connected to a first high-frequency power source, a second cathode connected to a second high-frequency power source, and a first anode placed between the first cathode and the second cathode. In the step of forming the first intrinsic semiconductor layer, the semiconductor substrate may be placed between the first cathode and the first anode so that the first-principal-surface side of the semiconductor substrate faces the first cathode, and the first high-frequency power source may be turned on. In the step of forming the second intrinsic semiconductor layer, the semiconductor substrate may be placed between the second cathode and the first anode so that the second-principal-surface side of the semiconductor substrate faces the second cathode, and the second high-frequency power source may be turned on.

(29) In the method of manufacturing a photoelectric conversion element according to Item (23), the second film forming chamber may include a third cathode connected to a third high-frequency power source, a fourth cathode connected to a fourth high-frequency power source, and a second anode placed between the third cathode and the fourth cathode. In the step of forming the first-conductivity-type semiconductor layer, the semiconductor substrate may be placed between the third cathode and the second anode so that the first-principal-surface side of the semiconductor substrate faces the third cathode, and the third high-frequency power source may be turned on. In the step of passing through the second film forming chamber, the semiconductor substrate may be placed between the fourth cathode and the second anode so that the second-principal-surface side of the semiconductor substrate faces the fourth cathode, and the fourth high-frequency power source may be turned off.

(30) In the method of manufacturing a photoelectric conversion element according to Item (23), the third film forming chamber may include a fifth cathode connected to a fifth high-frequency power source, a sixth cathode connected to a sixth high-frequency power source, and a third anode placed between the fifth cathode and the sixth cathode. In the step of passing through the third film forming chamber, the semiconductor substrate may be placed between the fifth cathode and the third anode so that the first-principal-surface side of the semiconductor substrate faces the fifth cathode, and the fifth high-frequency power source may be turned off. In the step of forming the second-conductivity-type semiconductor layer, the semiconductor substrate may be placed between the sixth cathode and the third anode so that the second-principal-surface side of the semiconductor substrate faces the sixth cathode, and the sixth high-frequency power source may be turned on.

(31) According to a third aspect of the present invention, there is provided a method of manufacturing a photoelectric conversion element, the photoelectric conversion element having a first principal surface and a second principal surface, and including at least a first-conductivity-type semiconductor layer, a semiconductor substrate, and a second-conductivity-type semiconductor layer in this order, the method using an inline film forming apparatus, and including: a step of forming the first-conductivity-type semiconductor layer; a step of passing through a second-conductivity-type film forming chamber; a step of passing through a first-conductivity-type film forming chamber; and a step of forming the second-conductivity-type semiconductor layer, the inline film forming apparatus including a first closed transportation path, a second closed transportation path, the first-conductivity-type film forming chamber, and the second-conductivity-type film forming chamber, the first closed transportation path being a closed path used to form the first-principal-surface side of the photoelectric conversion element, the second closed transportation path being a closed path used to form the second-principal-surface side of the photoelectric conversion element, a part of the first closed transportation path and a part of the second closed transportation path being placed in the first-conductivity-type film forming chamber, another part of the first closed transportation path and another part of the second closed transportation path being placed in the second-conductivity-type film forming chamber, the second-conductivity-type film forming chamber being connected to the first-conductivity-type film forming chamber in series. In the step of forming the first-conductivity-type semiconductor layer, the first-conductivity-type semiconductor layer is formed on the first-principal-surface side of the semiconductor substrate that is placed in the first closed transportation path in the first-conductivity-type film forming chamber. In the step of passing through the second-conductivity-type film forming chamber, the semiconductor substrate placed in the first closed transportation path passes through the second-conductivity-type film forming chamber, under a state in which no film is formed on the first-principal-surface side. In the step of passing through the first-conductivity-type film forming chamber, the semiconductor substrate placed in the second closed transportation path passes through the first-conductivity-type film forming chamber, under a state in which no film is formed on the second-principal-surface side. In the step of forming the second-conductivity-type semiconductor layer, the second-conductivity-type semiconductor layer is formed on the second-principal-surface side of the semiconductor substrate placed in the second closed transportation path in the second-conductivity-type film forming chamber.

(32) The method of manufacturing a photoelectric conversion element according to Item (31) may further include a step of moving the semiconductor substrate that has been placed in the first closed transportation path to the second closed transportation path, with the second-principal-surface side exposed, the step of moving the semiconductor substrate to the second closed transportation path being executed after the step of forming the first-conductivity-type semiconductor layer and the step of passing through the second-conductivity-type film forming chamber. The step of passing through the first-conductivity-type film forming chamber and the step of forming the second-conductivity-type semiconductor layer may be executed after the step of moving the semiconductor substrate to the second closed transportation path.

(33) The method of manufacturing a photoelectric conversion element according to Item (31) may further include a step of moving the semiconductor substrate that has been placed in the second closed transportation path to the first closed transportation path, with the first-principal-surface side exposed, the step of moving the semiconductor substrate to the first closed transportation path being executed after the step of passing through the first-conductivity-type film forming chamber and the step of forming the second-conductivity-type semiconductor layer. The step of forming the first-conductivity-type semiconductor layer and the step of passing through the second-conductivity-type film forming chamber may be executed after the step of moving the semiconductor substrate to the first closed transportation path.

(34) In the method of manufacturing a photoelectric conversion element according to any one of Items (31) to (33), the step of forming the first-conductivity-type semiconductor layer and the step of passing through the first-conductivity-type film forming chamber may be executed in the same period.

(35) In the method of manufacturing a photoelectric conversion element according to any one of Items (31) to (34), the step of passing through the second-conductivity-type film forming chamber and the step of forming the second-conductivity-type semiconductor layer may be executed in the same period.

DESCRIPTION OF EMBODIMENTS

First Embodiment

An embodiment of the present disclosure is described below with reference to the drawings.

[Photoelectric Conversion Element 100]

Figure 1:
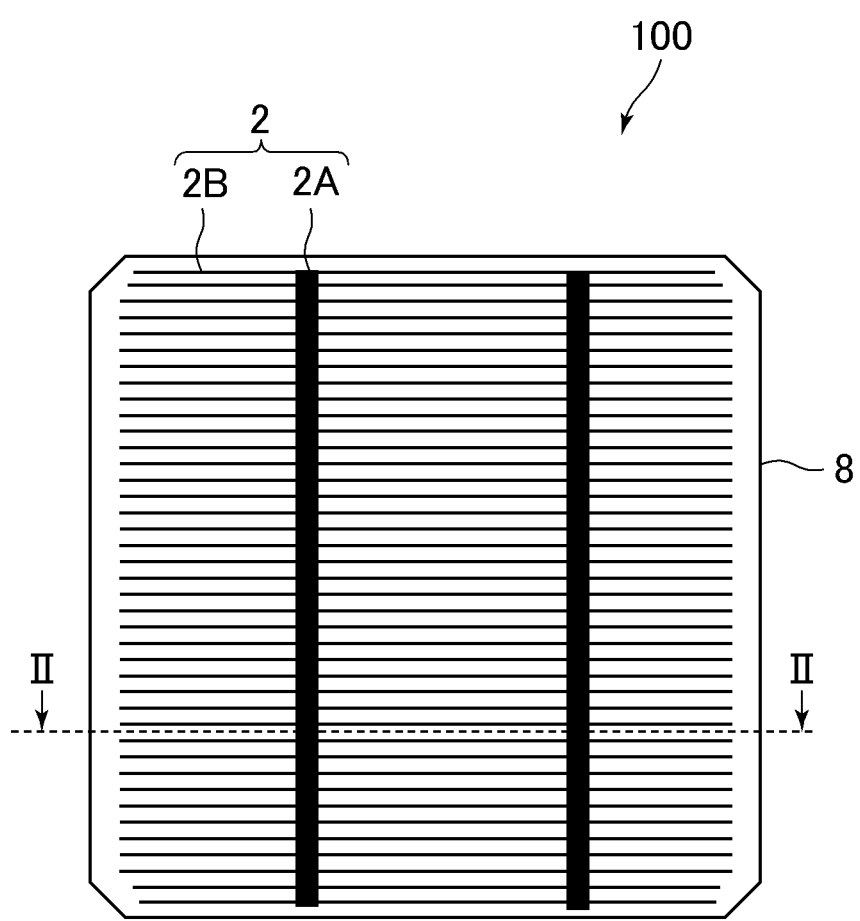
FIG. 1 is a schematic plan view for illustrating the front side (light receiving-surface side) of a photoelectric conversion element of an embodiment of the present disclosure.

FIG. 1 is a schematic plan view for illustrating the front side (light receiving-surface side) of a photoelectric conversion element 100 of this embodiment.

As illustrated in FIG. 1, the photoelectric conversion element 100 of this embodiment includes a photoelectric conversion unit 8 and a collecting electrode 2 provided on the front side of the photoelectric conversion unit 8. The collecting electrode 2 includes two wide bus bar electrodes 2A substantially parallel to one side of a semiconductor substrate included in the photoelectric conversion unit 8, and a large number of narrow finger electrodes 2B substantially orthogonal to the bus bar electrodes 2A.

In this embodiment, the collecting electrode 2 is provided on the back side of the photoelectric conversion unit 8 as well, and the collecting electrode 2 on the front side has a first polarity whereas the collecting electrode 2 on the back side has a polarity opposite from the first polarity. In this embodiment, the collecting electrode 2 on the front side has the positive polarity, and the collecting electrode 2 on the back side has the negative polarity.

Figure 2:
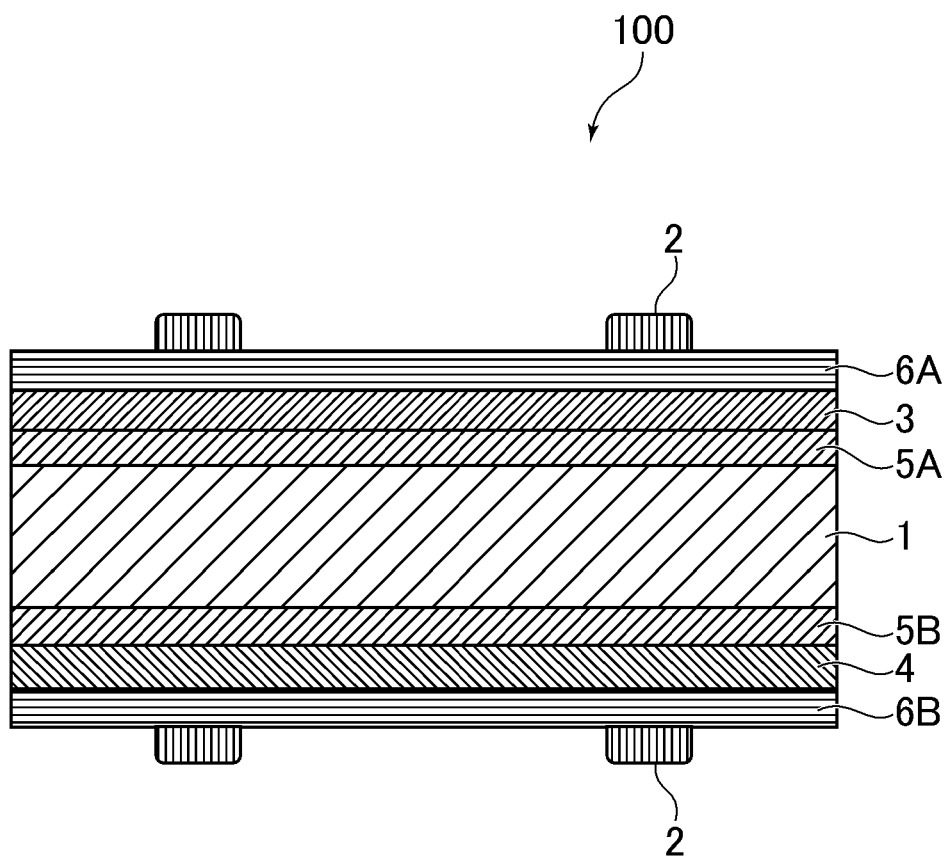
FIG. 2 is a schematic sectional view taken along the line II-II of FIG. 1.

FIG. 2 is a schematic sectional view taken along the line II-II of FIG. 1.

As illustrated in FIG. 2, the photoelectric conversion element 100 in this embodiment includes a semiconductor substrate 1 made of, for example, single-crystal silicon or polycrystalline silicon. A first intrinsic semiconductor layer 5A is formed on the front side of the semiconductor substrate 1, and a second intrinsic semiconductor layer 5B is formed on the back side of the semiconductor substrate 1. A P-type semiconductor layer 3 is formed on the front side of the first intrinsic semiconductor layer 5A, and an N-type semiconductor layer 4 is formed on the back side of the second intrinsic semiconductor layer 5B. A first transparent conductive layer 6A is formed on the front side of the P-type semiconductor layer 3, and a second transparent conductive layer 6B is formed on the back side of the N-type semiconductor layer 4.

[Method of Manufacturing Photoelectric Conversion Element]

A method of manufacturing the photoelectric conversion element 100 according to this embodiment is described below with reference to the drawings.

Example 1

Figure 3:
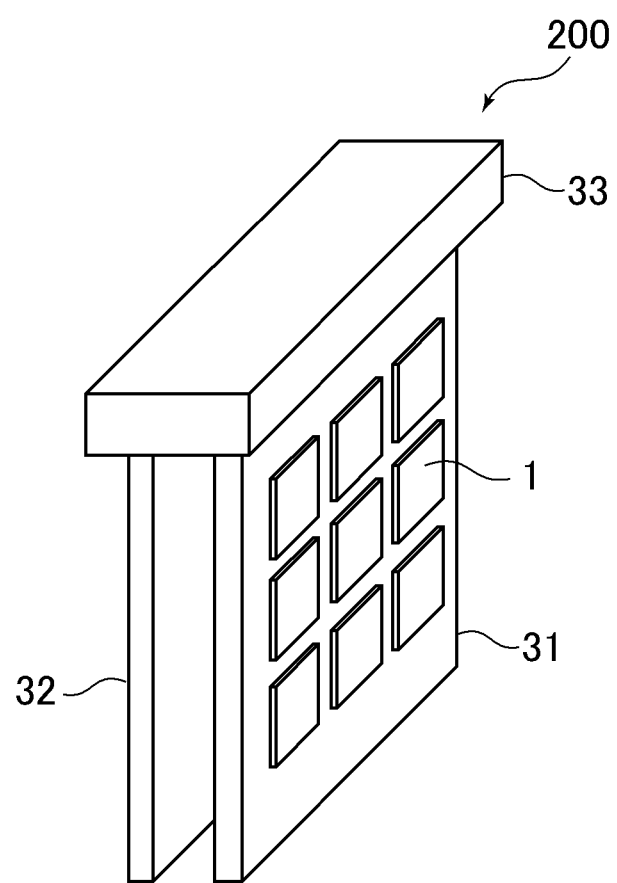
FIG. 3 is a schematic perspective view for illustrating a substrate holder to be used in a method of manufacturing a photoelectric conversion element according to this embodiment.

FIG. 3 is a schematic perspective view for illustrating a substrate holder 200 to be used in the method of manufacturing the photoelectric conversion element 100 according to this embodiment.

As illustrated in FIG. 3, the substrate holder 200 includes a first holder 31, a second holder 32, and a holding portion 33, which holds the first holder 31 and the second holder 32. The first holder 31 and the second holder 32 each have a substrate mounting surface, and are arranged so that a surface of the first holder 31 that is opposite from the substrate mounting surface of the first holder 31 faces a surface of the second holder 32 that is opposite from the substrate mounting surface of the second holder 32.

Figure 4:
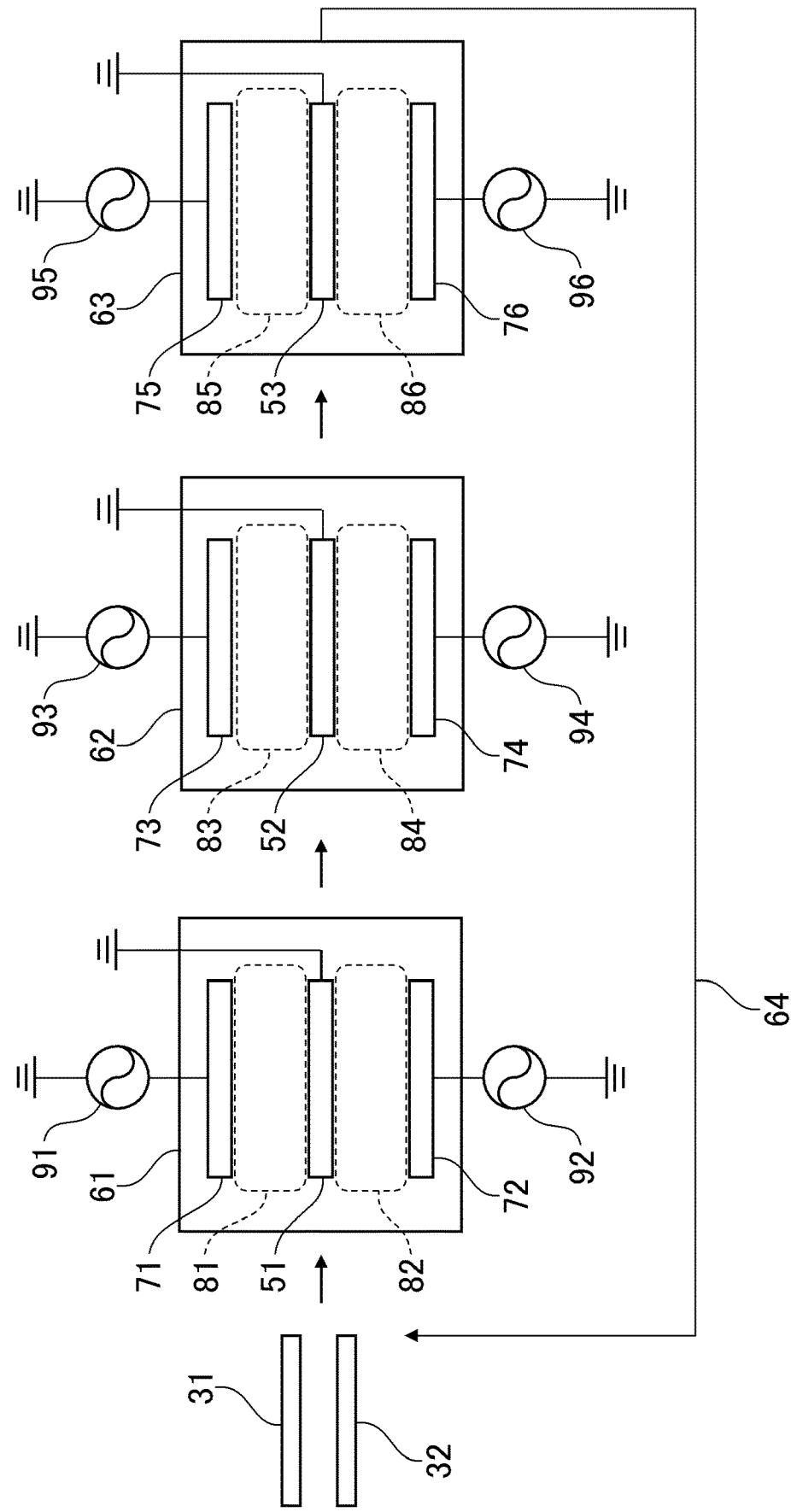
FIG. 4 is a schematic top view for illustrating a film forming apparatus to be used in the method of manufacturing a photoelectric conversion element according to this embodiment.

FIG. 4 is a schematic top view for illustrating a film forming apparatus 300 to be used in the method of manufacturing the photoelectric conversion element 100 according to this embodiment.

As illustrated in FIG. 4, the film forming apparatus 300 used in this embodiment includes a first film forming chamber 61, in which an intrinsic semiconductor layer is formed, a second film forming chamber 62, in which a first-conductivity-type semiconductor layer is formed, and a third film forming chamber 63, in which a second-conductivity-type semiconductor layer is formed. The film forming apparatus 300 is configured as an inline plasma chemical vapor deposition (CVD) apparatus by connecting the film forming chambers in series, and the substrate holder 200 carried into the first film forming chamber 61 is accordingly transported in a direction toward the third film forming chamber 63 in order.

The film forming apparatus 300 in this embodiment further includes transportation means 64 for returning the substrate holder 200 from the third film forming chamber 63 to the first film forming chamber 61, and the semiconductor substrates 1 that have undergone a film forming process in the third film forming chamber 63 are subjected to a film forming process in the first film forming chamber 61 again.

In the film forming apparatus 300 of a third aspect of the present invention, a path along which the first holder 31 is carried is defined as a "first closed transportation path", and a path along which the second holder 32 is carried is defined as a "second closed transportation path". In this embodiment, an example of forming a film on the front side (light receiving-surface side) of the photoelectric conversion element 100 in the first closed transportation path and forming a film on the back side of the photoelectric conversion element 100 in the second closed transportation path is described. Another manufacturing method may be employed in which a film is formed on the back side of the photoelectric conversion element 100 in the first closed transportation path and a film is formed on the front side of the photoelectric conversion element 100 in the second closed transportation path.

The first film forming chamber 61 includes a first cathode 71 and a second cathode 72, which are connected to high-frequency power sources, and a first anode 51, which is grounded. The first cathode 71 and the second cathode 72 are placed at two ends in the first film forming chamber 61, and the first anode 51 is placed between the first cathode 71 and the second cathode 72. The substrate holder 200 holding the first holder 31 and the second holder 32 is carried into the first film forming chamber 61 to be electrically connected to the first anode 51. The first holder 31 and the second holder 32 then function as an anode integrally with the first anode 51. A first film forming place 81 is defined between the first cathode 71 and the first anode 51, and a second film forming place 82 is defined between the second cathode 72 and the first anode 51. When a first high-frequency power source 91 connected to the first cathode 71 is turned on, plasma discharge is caused between the first cathode 71 and the first anode 51. When a second high-frequency power source 92 connected to the second cathode 72 is turned on, plasma discharge is caused between the second cathode 72 and the first anode 51.

In the third aspect of the present invention, a part of the first closed transportation path described above is located in the first film forming place 81 in the first film forming chamber 61, and a part of the second closed transportation path is located in the second film forming place 82 in the first film forming chamber 61. The first holder 31 is carried to the first film forming place 81 in the first closed transportation path, and the second holder 32 is carried to the second film forming place 82 in the second closed transportation path.

In this embodiment, the first cathode 71 and the second cathode 72 are showerhead electrodes, and have gas inlets through which a raw material gas and others are supplied.

In this embodiment, the first anode 51 has a built-in heater, and is capable of raising the temperatures of the first holder 31 and the second holder 32, which are placed near the first anode 51, during film forming.

With this configuration, the first film forming chamber 61 in this embodiment supplies a silicon-containing gas serving as a raw material gas, and others, from the first cathode 71 and from the second cathode 72 and also heats the semiconductor substrates 1 mounted on the substrate holder 200 with the use of the heater built in the first anode 51, and the first high-frequency power source 91 and the second high-frequency power source 92 are turned on, to thereby cause plasma discharge between the first cathode 71 and the first anode 51, and between the second cathode 72 and the first anode 51 and ionize the raw material gas. An intrinsic semiconductor layer is formed by depositing the ionized raw material gas components on a front surface or back surface of each semiconductor substrate 1.

The second film forming chamber 62 includes a third cathode 73, a fourth cathode 74, and a second anode 52, which is grounded. A third film forming place 83 is defined between the third cathode 73 and the second anode 52, and a fourth film forming place 84 is defined between the fourth cathode 74 and the second anode 52. The third cathode 73 is connected to a third high-frequency power source 93, and the fourth cathode 74 is connected to a fourth high-frequency power source 94. The third cathode 73, the fourth cathode 74, the second anode 52, the third high-frequency power source 93, and the fourth high-frequency power source 94 have configurations that are basically the same as those of the first cathode 71, the second cathode 72, the first anode 51, the first high-frequency power source 91, and the second high-frequency power source 92 of the first film forming chamber 61, and descriptions on the configurations are therefore omitted.

In the third aspect of the present invention, a part of the first closed transportation path described above is located in the third film forming place 83 in the second film forming chamber 62, and a part of the second closed transportation path is located in the fourth film forming place 84 in the second film forming chamber 62. The first holder 31 is carried to the third film forming place 83 in the first closed transportation path, and the second holder 32 is carried to the fourth film forming place 84 in the second closed transportation path.

The third film forming chamber 63 includes a fifth cathode 75, a sixth cathode 76, and a third anode 53, which is grounded. A fifth film forming place 85 is defined between the fifth cathode 75 and the third anode 53, and a sixth film forming place 86 is defined between the sixth cathode 76 and the third anode 53. The fifth cathode 75 is connected to a fifth high-frequency power source 95, and the sixth cathode 76 is connected to a sixth high-frequency power source 96. The fifth cathode 75, the sixth cathode 76, the third anode 53, the fifth high-frequency power source 95, and the sixth high-frequency power source 96 have configurations that are basically the same as those of the first cathode 71, the second cathode 72, the first anode 51, the first high-frequency power source 91, and the second high-frequency power source 92 of the first film forming chamber 61, and descriptions on the configurations are therefore omitted.

In the third aspect of the present invention, a part of the first closed transportation path described above is located in the fifth film forming place 85 in the third film forming chamber 63, and a part of the second closed transportation path is located in the sixth film forming place 86 in the third film forming chamber 63. The first holder 31 is carried to the fifth film forming place 85 in the first closed transportation path, and the second holder 32 is carried to the sixth film forming place 86 in the second closed transportation path.

The description given above on this embodiment takes as an example a configuration in which the film forming apparatus 300 has three film forming chambers. However, a configuration in which another film forming chamber is interposed between two of the three film forming chambers may be employed. That is, the description "the film forming chambers are connected in series" given above encompasses a configuration in which the film forming chambers are connected indirectly in series via another film forming chamber.

The description on this embodiment takes as an example a method in which, under the assumption that the first-conductivity-type semiconductor is a P-type semiconductor and the second-conductivity-type semiconductor is an N-type semiconductor, a P-type semiconductor layer is formed in the second film forming chamber 62, and an N-type semiconductor layer is formed in the third film forming chamber 63. However, a method in which the first-conductivity-type semiconductor is an N-type semiconductor and the second-conductivity-type semiconductor is a P-type semiconductor may be employed.

[Step of Placing First Semiconductor Substrate in First Film Forming Place of First Film Forming Chamber]

The semiconductor substrates 1 with no intrinsic semiconductor layer formed on the front side and the back side are prepared first. Each semiconductor substrate 1 may be, for example, a single-crystal silicon substrate or a polycrystalline silicon substrate. When a single-crystal silicon substrate is used as the semiconductor substrate 1, the substrate contains an impurity that supplies electric charges to silicon in order to impart conductivity. To give a specific example, single-crystal silicon substrates are divided into an n type, which contains an atom (for example, phosphorus) for introducing an electron into a silicon atom, and a p-type, which contains an atom (for example, boron) for introducing a hole into a silicon atom. An electron small in effective mass and scattering cross-section is generally higher in mobility than a hole. It is desirable from those points to use an n-type single-crystal silicon substrate as the semiconductor substrate 1. The semiconductor substrate 1 is desirably a substrate that has fine surface irregularities (texture). This is because the light intake efficiency can be improved by the fine surface irregularities.

The semiconductor substrates 1 are mounted on the substrate mounting surface of the first holder 31 illustrated in FIG. 3. When placing the semiconductor substrates 1 on the substrate mounting surface of the first holder 31, the back surface of each semiconductor substrate 1 is faced to the first holder 31, so that the front side of the semiconductor substrate 1 is exposed. In the third aspect of the present invention, the semiconductor substrates 1 are placed in the first closed transportation path with the front side of the semiconductor substrates 1 exposed.

In this embodiment, the semiconductor substrate 1 on which a desired thin film is not formed on both of the front side and the back side is referred to as a "first semiconductor substrate".

The substrate holder 200 with the first semiconductor substrates mounted on the first holder 31 is carried into the first film forming chamber 61. At this point, the first holder 31 and the second holder 32 are electrically connected to the first anode 51, the first holder 31 is placed in the first film forming place 81 described above, and the second holder 32 is placed in the second film forming place 82 described above.

[Step of Forming First Intrinsic Semiconductor Layer]

When the first semiconductor substrates are placed in the first film forming place 81, a door of the first film forming chamber 61 is closed and the interior of the first film forming chamber 61 is vacuumized, and then a silicon-containing gas serving as a raw material gas, and others, are supplied from the first cathode 71, which is a showerhead electrode. In this embodiment, $SiH_4$ gas and $H_2$ gas are supplied to the first film forming place 81.

Figure 5:
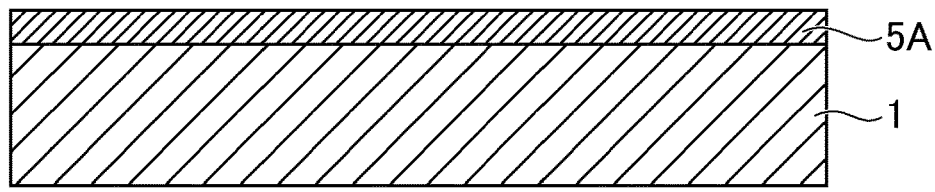
FIG. 5 is a schematic sectional view for illustrating a process of manufacturing the photoelectric conversion element of this embodiment.

In this embodiment, the heater built in the first anode 51 is used to heat the semiconductor substrates 1 mounted on the first holder 31, and the first high-frequency power source 91 is turned on, to thereby cause plasma discharge between the first cathode 71 and the first anode 51. With the thus-caused plasma discharge, the $SiH_4$ gas serving as a raw material gas and the $H_2$ gas are ionized to form, as illustrated in FIG. 5, an intrinsic amorphous silicon layer as the first intrinsic semiconductor layer 5A on the front surface of each semiconductor substrate 1 that is the first semiconductor substrate.

[Step of Forming First-Conductivity-Type Semiconductor Layer]

Once the first intrinsic semiconductor layer 5A is formed on the front surface of the semiconductor substrate 1, the door of the first film forming chamber 61 is opened to move the substrate holder 200 into the second film forming chamber 62. In the second film forming chamber 62, the first holder 31 and the second holder 32 are electrically connected to the second anode 52, the first holder 31 is placed in the third film forming place 83 described above, and the second holder 32 is placed in the fourth film forming place 84 described above. A door of the second film forming chamber 62 is then closed, and the interior of the second film forming chamber 62 is vacuumized. Subsequently, $SiH_4$ gas as a raw material gas, $H_2$ gas, and $B_2H_6$ gas, which is diluted with hydrogen as a dopant addition gas, are supplied to the third film forming place 83 in the second film forming chamber 62, from the third cathode 73, which is a showerhead electrode. Only a minute amount of dopant impurity is required to be added, and a mixture gas diluted with $SiH_4$ and $H_2$ in advance may therefore be used.

Figure 6:
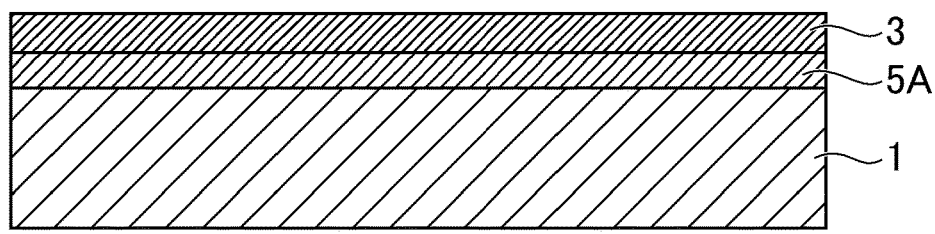
FIG. 6 is a schematic sectional view for illustrating the process of manufacturing the photoelectric conversion element of this embodiment.

In this embodiment, a heater built in the second anode 52 is used to heat the semiconductor substrates 1 mounted on the first holder 31, and the third high-frequency power source 93 is turned on, to thereby cause plasma discharge between the third cathode 73 and the second anode 52. With the thus-caused plasma discharge, the P-type semiconductor layer 3 as a first-conductivity-type semiconductor layer is formed on the front side of the first intrinsic semiconductor layer 5A as illustrated in FIG. 6.

A P-type amorphous silicon layer or a P-type microcrystalline silicon layer is preferred as the P-type semiconductor layer 3. In the film forming of the P-type semiconductor layer 3, gas containing a heterogeneous element, such as $CH_4$, $CO_2$, $NH_3$, and $GeH_4$, may be added to alloy a silicon-based thin film, to thereby change an energy gap of the silicon-based thin film. A minute amount of oxygen, carbon, or similar impurity may also be added in order to improve the light transmittance. This is accomplished by introducing $CO_2$, $CH_4$, or similar gas during the film forming by CVD.

[Step of Passing Through Third Film Forming Chamber]

Once the P-type semiconductor layer 3 is formed on the front side of the first intrinsic semiconductor layer 5A, the door of the second film forming chamber 62 is opened to move the substrate holder 200 into the third film forming chamber 63. In the third film forming chamber 63, the first holder 31 and the second holder 32 are electrically connected to the third anode 53, the first holder 31 is placed in the fifth film forming place 85 described above, and the second holder 32 is placed in the sixth film forming place 86 described above.

In this embodiment, the third film forming chamber 63 is a film forming chamber in which the N-type semiconductor layer 4 is formed, and the N-type semiconductor layer 4 is not to be formed on the front side of the P-type semiconductor layer 3. The semiconductor substrates 1 that are mounted on the first holder 31 placed in the fifth film forming place 85 therefore pass through the third film forming chamber 63 without any film being formed on the semiconductor substrates 1. That is, in the step of passing through the third film forming chamber, the fifth high-frequency power source 95 connected to the fifth cathode 75 is turned off so that no film is formed on the semiconductor substrates 1 mounted on the first holder 31. In this state, it is also possible to stop gas supply from the fifth cathode 75, which is a showerhead electrode.

[Transportation Step and Inversion Step]

After the substrate holder 200 passes through the third film forming chamber 63, a transportation step is executed in which the substrate holder 200 is carried into the first film forming chamber 61 again by the transportation means 64 described above.

As illustrated in FIG. 6, the first intrinsic semiconductor layer 5A and the P-type semiconductor layer 3 have been formed on the front side of each semiconductor substrate 1 that has passed through the third film forming chamber 63.

The semiconductor substrate 1 with a desired thin film formed on the front side as this one is referred to as a "second semiconductor substrate".

An inversion step is executed next to flip the semiconductor substrates 1 that are the second semiconductor substrates having been mounted on the first holder 31, which is illustrated in FIG. 3, with the front side exposed, so that the semiconductor substrates 1 are mounted on the substrate mounting surface of the second holder 32 with the back side of each semiconductor substrate 1 exposed.

In the third aspect of the present invention, the semiconductor substrates 1 placed in the first closed transportation path is moved to the second closed transportation path, with the back side of each semiconductor substrate 1 exposed, by executing the transportation step and the inversion step.

In this embodiment, new first semiconductor substrates with a desired thin film not formed on both of the front side and the back side are further mounted on the substrate mounting surface of the first holder 31, which is now free as a result of moving the second semiconductor substrates to the second holder 32, in a manner that exposes the front side of each new first semiconductor substrate.

In short, in the third aspect of the present invention, each first semiconductor substrate is placed in the first closed transportation path with the front side exposed, and each second semiconductor substrate is placed in the second closed transportation path with the back side exposed.

It does not matter which of the transportation step and the inversion step is executed first. That is, the transportation step may be executed after the inversion step is executed at the exit of the third film forming chamber 63. As an alternative method, the inversion step may be executed in the middle of the transportation step.

[Step of Placing Second Semiconductor Substrates in Second Film Forming Place of First Film Forming Chamber]

Once the second semiconductor substrates are mounted on the substrate mounting surface of the second holder 32 and the first semiconductor substrates are mounted on the substrate mounting surface of the first holder 31, the substrate holder 200 is carried into the first film forming chamber 61 again. In the first film forming chamber 61, the first holder 31 and the second holder 32 are electrically connected to the first anode 51, the first holder 31 is placed in the first film forming place 81 described above, and the second holder 32 is placed in the second film forming place 82 described above.

That is, the step of placing the second semiconductor substrates in the second film forming place 82 of the first film forming chamber 61 and the step of placing the first semiconductor substrates described above in the first film forming place 81 of the first film forming chamber 61 are executed substantially concurrently.

[Step of Forming Second Intrinsic Semiconductor Layer]

Once the first semiconductor substrates are placed in the first film forming place 81 and the second semiconductor substrates are placed in the second film forming place 82, the door of the first film forming chamber 61 is closed and the interior of the first film forming chamber 61 is vacuumized. A silicon-containing gas serving as a raw material gas, and others, are then supplied from the first cathode 71 and the second cathode 72, which are showerhead electrodes. In this embodiment, $SiH_4$ gas and $H_2$ gas are supplied to the first film forming place 81 and the second film forming place 82.

This means that a common raw material gas is supplied to the first film forming place 81 and the second film forming place 82. In the present disclosure, the expression "a common raw material gas is supplied" is used also when the raw material gas supplied to one place and the raw material gas supplied to another place differ solely in ratio.

Figure 7:
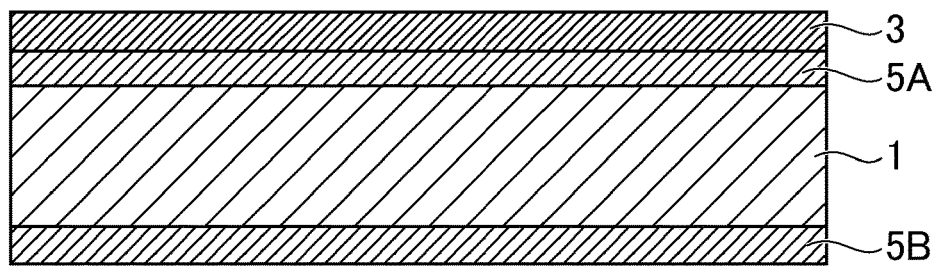
FIG. 7 is a schematic sectional view for illustrating the process of manufacturing the photoelectric conversion element of this embodiment.

In this embodiment, the heater built in the first anode 51 is used to heat the first semiconductor substrates mounted on the first holder 31 and the second semiconductor substrates mounted on the second holder 32. The first high-frequency power source 91 connected to the first cathode 71 is then turned on, to thereby cause plasma discharge between the first cathode 71 and the first anode 51. The second high-frequency power source 92 connected to the second cathode 72 is also turned on, to thereby cause plasma discharge between the second cathode 72 and the first anode 51. With the thus-caused plasma discharge, the $SiH_4$ gas serving as a raw material gas and the $H_2$ gas are ionized to form, as illustrated in FIG. 5, an intrinsic amorphous silicon layer as the first intrinsic semiconductor layer 5A on the front surface of each of the semiconductor substrates 1 that are the first semiconductor substrates mounted on the first holder 31, and to form, as illustrated in FIG. 7, an intrinsic amorphous silicon layer as the second intrinsic semiconductor layer 5B on the back surface of each of the semiconductor substrates 1 that are the second semiconductor substrates mounted on the second holder 32.

A common raw material gas is supplied to the first film forming place 81 and the second film forming place 82 as described above, which gives a common composition to the first intrinsic semiconductor layer 5A and the second intrinsic semiconductor layer 5B.

In the first film forming chamber 61 in this embodiment, the first high-frequency power source 91 and the second high-frequency power source 92 may be formed as a shared high-frequency power source.

The step of forming the second intrinsic semiconductor layer and the step of forming the first intrinsic semiconductor layer described above are executed in the same period. The expression "executed in the same period" means that the steps are executed in the same duration from the closing of the door of a film forming chamber that houses the first semiconductor substrates and the second semiconductor substrates to the opening of the door, and encompasses a case in which film forming on the first semiconductor substrates and film forming on the second semiconductor substrates are not strictly concurrent.

This method does not require separate film forming chambers for forming a first thin film (intrinsic semiconductor layer in this embodiment) on the front side of each semiconductor substrate 1 and for forming a second thin film on the back side of each semiconductor substrate 1 with the use of a raw material gas common to the first thin film, and accordingly accomplishes the downsizing of an inline manufacturing apparatus.

In the third aspect of the present invention, the first closed transportation path along which the first holder 31 is carried and the second closed transportation path along which the second holder 32 is carried can be separated by this manufacturing method. As a result, a first-conductivity-type semiconductor layer (P-type semiconductor layer 3 in this embodiment) is formed and no second-conductivity-type semiconductor layer (N-type semiconductor layer 4 in this embodiment) is formed in the first closed transportation path. Similarly, a second-conductivity-type semiconductor layer is formed and no first-conductivity-type semiconductor layer is formed in the second closed transportation path. This means that the first holder 31 to which an impurity added to the first first-conductivity-type semiconductor layer is adhering is not required in the forming of the second-conductivity-type semiconductor layer, and that the second holder 32 to which an impurity added to the second-conductivity-type semiconductor layer is adhering is not required in the forming of the first-conductivity-type semiconductor layer. It is therefore not required to form, for the purpose of preventing an impurity added to the first-conductivity-type semiconductor layer from mixing in the second-conductivity-type semiconductor layer, an intrinsic semiconductor layer on a front surface of the first holder 31 after the first-conductivity-type semiconductor layer is formed. Similarly, it is not required to form, for the purpose of preventing an impurity added to the second-conductivity-type semiconductor layer from mixing in the first-conductivity-type semiconductor layer, an intrinsic semiconductor layer on aback surface of the second holder 32 after the second-conductivity-type semiconductor layer is formed. Improvement in manufacturing efficiency is accomplished as a result.

In addition, an inline manufacturing process high in productivity is realized because the step of forming the second intrinsic semiconductor layer and the step of forming the first intrinsic semiconductor layer described above can be executed in the same period.

The realized inline manufacturing process is high in quality of a formed film as well as in productivity because, with the process of the present disclosure, the film forming condition of the first film forming place 81 and the film forming condition of the second film forming place 82 can be kept constant during film forming in the first film forming chamber 61 even when the film forming condition of the first intrinsic semiconductor layer 5A to be formed on the front side of each semiconductor substrate 1 and the film forming condition of the second intrinsic semiconductor layer 5B to be formed on the back side of each semiconductor substrate 1 differ from each other. That is, with the process of the present disclosure, conditions including the electric power condition of the first high-frequency power source 91 connected to the first cathode 71, ratio and flow rate conditions of gases that are supplied to the first film forming place 81, and temperature and film forming pressure conditions of the first film forming place 81 can be fixed to conditions for forming the first intrinsic semiconductor layer 5A because the first holder 31 on which the front side of each semiconductor substrate 1 is exposed is carried always to the first film forming place 81. Further, conditions including the electric power condition of the second high-frequency power source 92 connected to the second cathode 72, ratio and flow rate conditions of gases that are supplied to the second film forming place 82, and temperature and film forming pressure conditions of the second film forming place 82 can be fixed to conditions for forming the second intrinsic semiconductor layer 5B because the second holder 32 on which the backside of each semiconductor substrate 1 is exposed is carried always to the second film forming place 82.

[Step of Passing Through Second Film Forming Chamber]

Once the first intrinsic semiconductor layer 5A is formed on the front surface of each first semiconductor substrate and the second intrinsic semiconductor layer 5B is formed on the back surface of each second semiconductor substrate, the door of the first film forming chamber 61 is opened to move the substrate holder 200 into the second film forming chamber 62. In the second film forming chamber 62, the second anode 52 is placed between the first holder 31 and the second holder 32, the first holder 31 is placed in the third film forming place 83 described above, and the second holder 32 is placed in the fourth film forming place 84 described above. In this embodiment, the step of placing the first holder 31 in the third film forming place 83 and the step of placing the second holder 32 in the fourth film forming place 84 are executed substantially concurrently.

In this embodiment, the second film forming chamber 62 is a film forming chamber in which the P-type semiconductor layer 3 is formed, and the P-type semiconductor layer 3 is not to be formed on the back side of the second intrinsic semiconductor layer 5B. The second semiconductor substrates that are mounted on the second holder 32 placed in the fourth film forming place 84 therefore pass through the second film forming chamber 62 without any film being formed on the second semiconductor substrates. That is, in the step of passing through the second film forming chamber, the fourth high-frequency power source 94 connected to the fourth cathode 74 is turned off so that no film is formed on the second semiconductor substrates mounted on the second holder 32. In this state, it is possible to stop gas supply from the fourth cathode 74, which is a showerhead electrode. When the fourth cathode 74 and the third cathode 73 are connected to a shared gas cylinder, an electromagnetic valve may be used to stop only gas supply to the fourth cathode 74.

The step of passing through the second film forming chamber may be executed in the same period as that during which the step of forming the first-conductivity-type semiconductor layer described above is executed. That is, the P-type semiconductor layer 3 can be formed on the front surface of the first intrinsic semiconductor layer 5A, which has been formed on the front side of each first semiconductor substrate, in the third film forming place 83 by turning on the third high-frequency power source 93 connected to the third cathode 73 and by supplying gases from the third cathode 73, which is a showerhead electrode, while keeping the fourth high-frequency power source 94 connected to the fourth cathode 74, turned off to maintain the state in which no film is formed on the second semiconductor substrates mounted on the second holder 32 in the fourth film forming place 84.

[Step of Forming Second-Conductivity-Type Semiconductor Layer]

After passing through the second film forming chamber 62, the substrate holder 200 is moved into the third film forming chamber 63. In the third film forming chamber 63, the third anode 53 is placed between the first holder 31 and the second holder 32, the first holder 31 is placed in the fifth film forming place 85 described above, and the second holder 32 is placed in the sixth film forming place 86 described above. A door of the third film forming chamber 63 is then closed, and the interior of the third film forming chamber 63 is vacuumized. Subsequently, $SiH_4$ gas as a raw material gas, $H_2$ gas, and $PH_3$ gas, which is diluted with hydrogen as a dopant addition gas, are supplied to the sixth film forming place 86 in the third film forming chamber 63, from the sixth cathode 76, which is a showerhead electrode. Only a minute amount of dopant impurity is required to be added, and a mixture gas diluted with $SiH_4$ and $H_2$ in advance may therefore be used.

Figure 8:
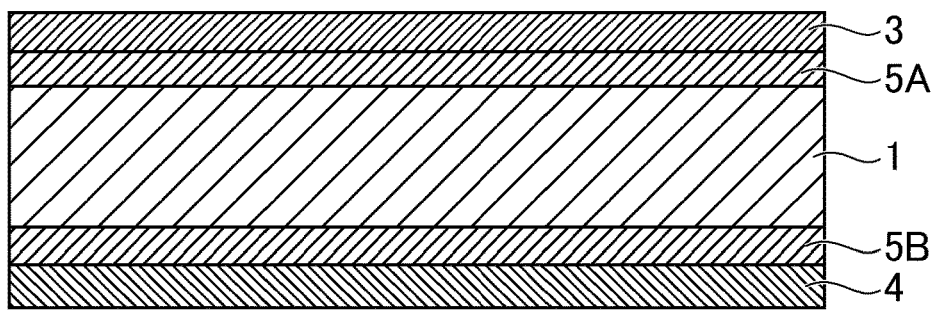
FIG. 8 is a schematic sectional view for illustrating the process of manufacturing the photoelectric conversion element of this embodiment.

In this embodiment, a heater built in the third anode 53 is used to heat the second semiconductor substrates mounted on the second holder 32, and the sixth high-frequency power source 96 is turned on, to thereby cause plasma discharge between the sixth cathode 76 and the third anode 53. With the thus-caused plasma discharge, the N-type semiconductor layer 4 as a second-conductivity-type semiconductor layer is formed on the back side of the second intrinsic semiconductor layer 5B as illustrated in FIG. 8.

An N-type amorphous silicon layer or an N-type microcrystalline silicon layer is preferred as the N-type semiconductor layer 4. In the film forming of the N-type semiconductor portion 4, gas containing a heterogeneous element, such as $CH_4$, $CO_2$, $NH_3$, and $GeH_4$, may be added to alloy a silicon-based thin film, to thereby change an energy gap of the silicon-based thin film. A minute amount of oxygen, carbon, or similar impurity may also be added in order to improve the light transmittance. This is accomplished by introducing $CO_2$, $CH_4$, or similar gas during the film forming by CVD.

The step of forming the second-conductivity-type semiconductor layer may be executed in the same period as that during which the step of passing through the third film forming chamber described above is executed. Specifically, the N-type semiconductor layer 4 can be formed on the back surface of the second intrinsic semiconductor layer 5B, which has been formed on the back side of each second semiconductor substrate, in the sixth film forming place 86 by turning on the sixth high-frequency power source 96 connected to the sixth cathode 76 and by supplying gases from the sixth cathode 76, which is a showerhead electrode, while keeping the fifth high-frequency power source 95 connected to the fifth cathode 75, turned off to maintain the state in which no film is formed on the first semiconductor substrates mounted on the first holder 31 in the fifth film forming place 85.

In a second aspect of the present invention, the use of this manufacturing method enables the film forming apparatus 300 that is small in size to manufacture, by an inline process, the photoelectric conversion element 100 in which the first intrinsic semiconductor layer 5A and the first-conductivity-type semiconductor layer (P-type semiconductor layer 3 in this embodiment) are formed on the front side of each semiconductor substrate 1, and the second intrinsic semiconductor layer 5B and the second-conductivity-type semiconductor layer (N-type semiconductor layer 4) are formed on the back side of the semiconductor substrate 1.

[Step of Forming Transparent Conductive Layer]

Another film forming apparatus or the like is then used to form the first transparent conductive layer 6A illustrated in FIG. 2 on the front side of the P-type semiconductor layer 3, and form the second transparent conductive layer 6B on the back side of the N-type semiconductor layer 4.

The method of forming the first transparent conductive layer 6A and the second transparent conductive layer 6B is not particularly limited, but sputtering and other physical vapor deposition methods, and metal organic chemical vapor deposition (MOCVD), which uses the reaction of an organic metal compound to oxygen or water, are preferred. Heat and energy from plasma discharge may be utilized in any of the film forming methods.

Component materials of the first transparent conductive layer 6A and the second transparent conductive layer 6B are transparent conductive metal oxides, examples of which include indium oxide, zinc oxide, tin oxide, titanium oxide, and a complex oxide of those materials. A non-metal transparent conductive material, for example, graphene may also be used. Of the examples of the component materials given above, an indium-based complex oxide having indium oxide as a main component is preferred for the first transparent conductive layer 6A and the second transparent conductive layer 6B from the viewpoint of high conductivity and transparency. It is more preferred to use indium oxide doped with a dopant in order to secure reliability and even higher conductivity. Examples of impurity used as the dopant include Sn, W, Ce, Zn, As, Al, Si, S, and Ti.

Figure 9:
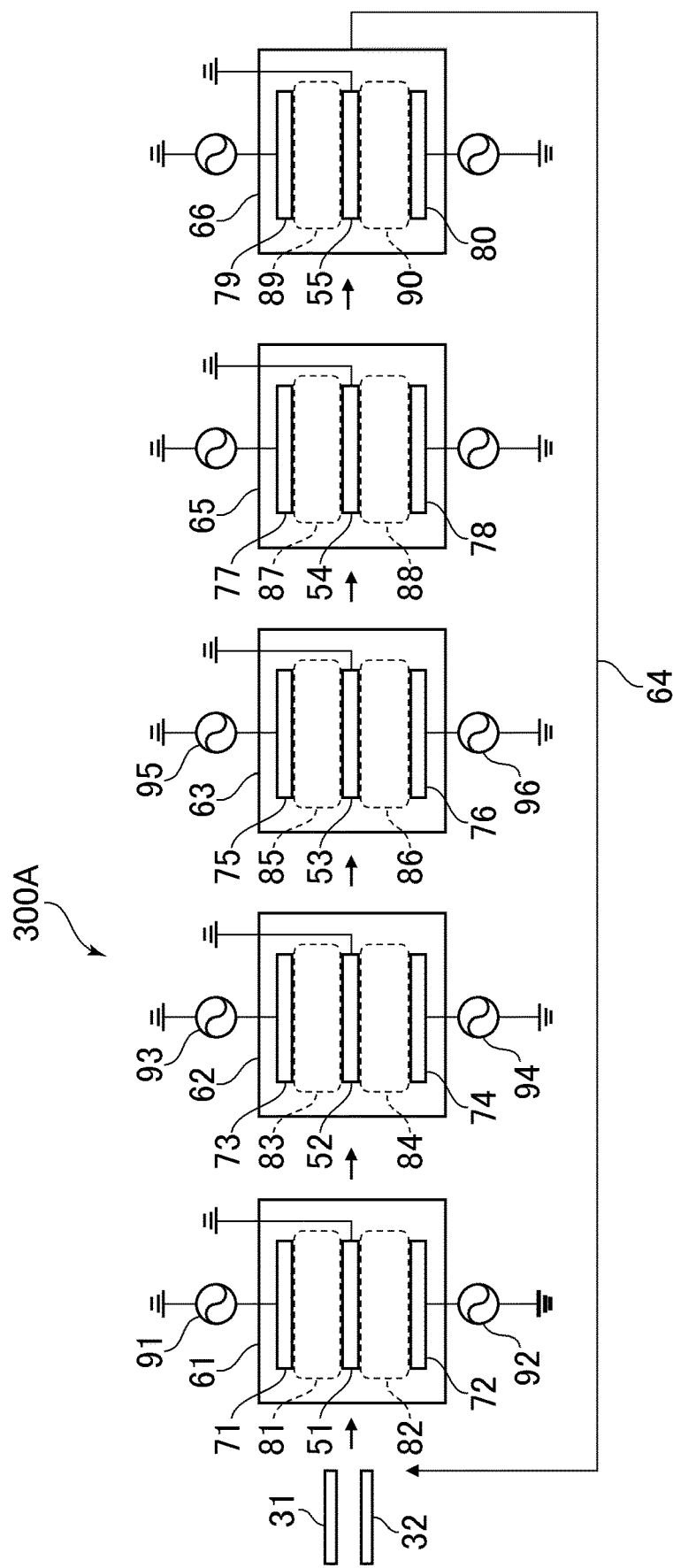
FIG. 9 is a schematic top view for illustrating another film forming apparatus to be used in the method of manufacturing a photoelectric conversion element according to this embodiment.

A configuration of a film forming apparatus 300A that is illustrated in FIG. 9 may be employed. In this configuration, a fourth film forming chamber 65 connected to the third film forming chamber 63 is included downstream of the third film forming chamber 63, and includes a seventh film forming place 87 and an eighth film forming place 88. The fourth film forming chamber 65 includes a seventh cathode 77, an eighth cathode 78, and a fourth anode 54, and has the same configuration as that of the first film forming chamber 61 and other film forming chambers described above. In this case, a method may be employed in which the first transparent conductive layer 6A is formed on the front side of the P-type semiconductor layer 3 in the seventh film forming place 87, and the second transparent conductive layer 6B is formed on the back side of the N-type semiconductor layer 4 in the eighth film forming place 88.

Specifically, the semiconductor substrates 1 with the first intrinsic semiconductor layer 5A and the P-type semiconductor layer 3 formed on the front side as illustrated in FIG. 6 are carried into the fourth film forming chamber 65 to form the first transparent conductive layer 6A on the front side of the P-type semiconductor layer 3 in the fourth film forming chamber 65. The semiconductor substrates 1 then undergo the transportation step and the inversion step described above, and are carried into the first film forming chamber 61 again as the second semiconductor substrates. The second intrinsic semiconductor layer 5B and the N-type semiconductor layer 4 are subsequently formed on the back side of each semiconductor substrate 1. After that, the semiconductor substrates 1 are carried into the fourth film forming chamber 65 again to form the second transparent conductive layer 6B on the back side of the N-type semiconductor layer 4.

[Step of Forming Collecting Electrode]

The collecting electrode 2 including the bus bar electrodes 2A and the finger electrodes 2B is then formed on each of the front side of the first transparent conductive layer 6A and the back side of the second transparent conductive layer 6B. The collecting electrode 2 includes one of an underlying electrode formed on the front side of the first transparent conductive layer 6A and an underlying electrode formed on the back side of the second transparent conductive layer 6B, and a plated electrode formed on the underlying electrode.

The underlying electrode may be formed by, for example, an ink jet method, screen printing, spraying, or roll coating. The underlying electrode may be patterned into a given shape, and screen printing is suitable to form the patterned underlying electrode in view of productivity. A preferred screen printing method uses a printing paste that contains conductive fine particles and a screen plate that has an opening pattern corresponding to the pattern shape of the collecting electrode 2 to print.

For example, silver, copper, aluminum, nickel, tin, bismuth, zinc, gallium, carbon, or a mixture thereof may be used as the conductive particles contained in the underlying electrode.

An epoxy-based resin, a phenol-based resin, an acrylic resin, or the like may be used as a thermosetting resin contained in the underlying electrode. The underlying electrode, which contains any thermosetting resin, is curable in a thermal curing process.

The underlying electrode may include a plurality of layers. For instance, the underlying electrode may have a structure including an underlayer that is low in contact resistance to the first transparent conductive layer 6A and the second transparent conductive layer 6B, and, with this structure, the fill factor of the photoelectric conversion element 100 is expected to improve.

The plated electrode is formed by precipitating out a metal by plating with the underlying electrode as a starting point. The metal to be precipitated out as the plated electrode is, for example, copper, nickel, tin, aluminum, chromium, or silver, and may be any material that can be formed by plating.

[Step of Forming Insulating Film]

Though not illustrated in FIG. 2, an insulating film may be formed on each of the front surface of the first transparent conductive layer 6A and the back surface of the second transparent conductive layer 6B, in an area where no collecting electrode 2 is formed. The forming of the insulating film protects the front surface of the first transparent conductive layer 6A and the back surface of the second transparent conductive layer 6B chemically and electrically from a plating solution in the plating for forming the plated electrode described above. In other words, precipitation of the metal on the surfaces of the first transparent conductive layer 6A and the second transparent conductive layer 6B can be prevented.

The step of forming the insulating film may be executed in, for example, a configuration in which the film forming apparatus 300A illustrated in FIG. 9 further includes a fifth film forming chamber 66 connected to the fourth film forming chamber 65, downstream of the fourth film forming chamber 65, and the fifth film forming chamber 66 includes a ninth film forming place 89 and a tenth film forming place 90. The fifth film forming chamber 66 includes a ninth cathode 79, a tenth cathode 80, and a fifth anode 55, and has the same configuration as that of the first film forming chamber 61 and other film forming chambers described above. In this case, a method may be employed in which a first insulating film is formed on the front side of the first transparent conductive layer 6A in the ninth film forming place 89, and a second insulating film is formed on the back side of the second transparent conductive layer 6B in the tenth film forming place 90.

Specifically, the semiconductor substrates 1 with the first intrinsic semiconductor layer 5A, the P-type semiconductor layer 3, and the first transparent conductive layer 6A formed on the front side are carried into the fifth film forming chamber 66 to form the first insulating film on the front side of the first transparent conductive layer 6A in the fifth film forming chamber 66. The semiconductor substrates 1 then undergo the transportation step and the inversion step described above, and are carried into the first film forming chamber 61 again as the second semiconductor substrates. The second intrinsic semiconductor layer 5B, the N-type semiconductor layer 4, and the second transparent conductive layer 6B are subsequently formed on the back side of each semiconductor substrate 1. After that, the semiconductor substrates 1 are carried into the fifth film forming chamber 66 again to form the second insulating film on the back side of the second transparent conductive layer 6B.

A material used to form the insulating film is required to be electrically insulative, and desirably has chemical stability with respect to the plating solution. The use of a material that is high in chemical stability with respect to the plating solution keeps the insulating film from dissolving when the plated electrode described above is formed, and consequently prevents damage to the front surface of the first transparent conductive layer 6A and the back surface of the second transparent conductive layer 6B.

The material used to form the insulating film is also preferred to be high in adhesion strength with respect to the first transparent conductive layer 6A and the second transparent conductive layer 6B. A high adhesion strength with respect to the first transparent conductive layer 6A and the second transparent conductive layer 6B keeps the insulating film from peeling when the plated electrode described above is formed, and consequently prevents precipitation of the metal on the first transparent conductive layer 6A and the second transparent conductive layer 6B.

The material used for the insulating film is preferred to be high in light transmittance. When light absorption by the insulating film is small, more light is taken into the semiconductor substrate 1. When the insulating film has satisfactorily high transparency, which is a transmittance of 90% or higher, an optical loss due to light absorption in the insulating film is so small that a process of removing the insulating film after the plated electrode is formed is not required, and the insulating film is left as it is to be used as a part of the photoelectric conversion element 100. The process of manufacturing the photoelectric conversion element 100 is consequently simplified, which leads to further improvement in productivity. When the process of removing the insulating film is eliminated, so that the insulating film is to be left as it is and used as a part of the photoelectric conversion element 100, it is more desirable to use for the insulating film a material that has satisfactorily high levels of weather resistance and stability to heat and humidity.

The material for forming the insulating film may be an inorganic insulating material or an organic insulating material. For example, silicon oxide, silicon nitride, titanium oxide, aluminum oxide, magnesium oxide, and other materials may be used as the inorganic insulating material. For example, polyester, an ethylene-vinyl acetate copolymer, acryl, epoxy, polyurethane, and other materials may be used as the organic insulating material.

Of such inorganic materials, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride, titanium oxide, strontium titanate, and the like are preferably used from the viewpoints of plating solution resistance and transparency. Of those, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride, and the like are preferred from the viewpoints of, for example, electrical characteristic and adhesion to a transparent electrode layer, and silicon oxide, silicon nitride, and the like are particularly preferably used from the viewpoint of appropriately adjusting the refractive index. Those inorganic materials are not limited to materials each having a stoichiometric composition, and materials each including an oxygen defect or the like may be adopted.

When silicon oxide, silicon nitride, or a similar inorganic insulating material is used as a component material of the insulating film, preferred methods of forming the insulating film are plasma CVD, sputtering, and other dry methods. When an organic insulating material is used as a component material of the insulating film, preferred methods of forming the insulating film are spin coating, screen printing, and other wet methods. With those methods, a film having a dense structure that is small in number of pin holes and other defects can be formed.

In this embodiment, the insulating film is formed by plasma CVD in view of forming a film that has an even denser structure. With this method, the formed insulating film can have a structure high in density not only when the film thickness is as thick as about 200 nm but also when the film thickness is as thin as about 30 nm to about 100 nm.

Example 2

Example 2 is an example related to a first aspect of the invention of the present disclosure.

In the example given above, the film forming apparatus 300 described with reference to FIG. 4 and the film forming apparatus 300A described with reference to FIG. 9 include the transportation means 64 to execute the transportation step and the inversion step described above. The present disclosure, however, is not limited to this example. For instance, when the film forming apparatus 300 or 300A does not include the transportation means 64, a method may be employed in which the second semiconductor substrates that have undergone the step of forming the first intrinsic semiconductor layer, the step of forming the first-conductivity-type semiconductor layer, and the step of passing through the third film forming chamber are stored, the stored second semiconductor substrates and the first semiconductor substrates on each of which a film is to be newly formed are carried into the first film forming chamber 61, and the step of forming the first intrinsic semiconductor layer and the step of forming the second intrinsic semiconductor layer described above are executed in the same period.

Figure 10:
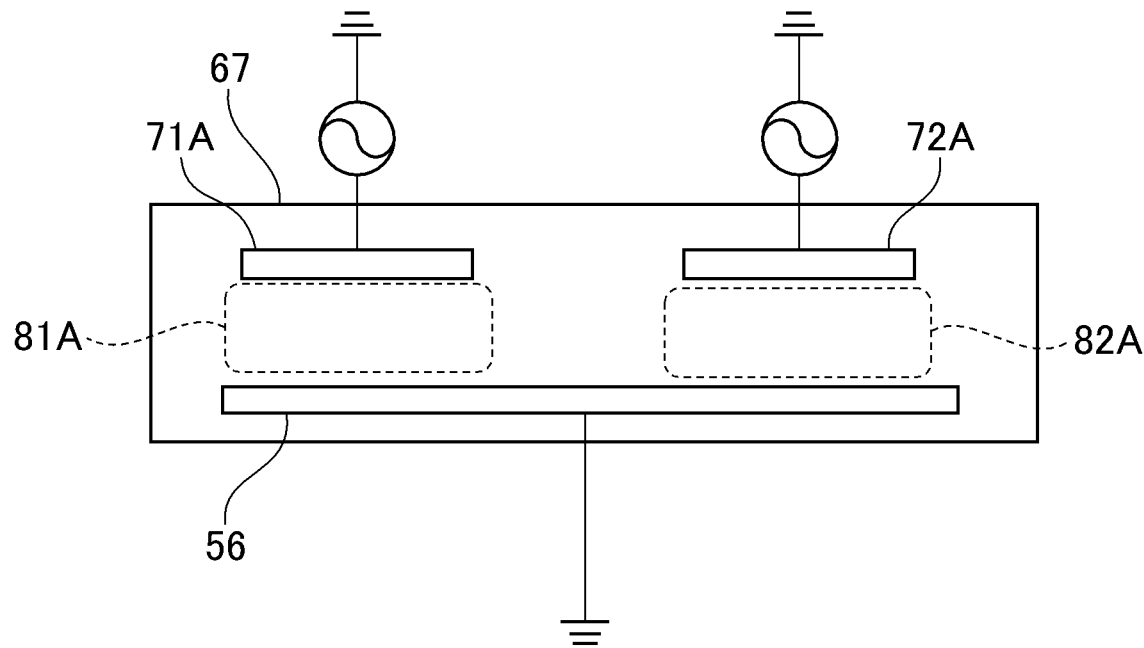
FIG. 10 is a schematic top view for illustrating Example 2 of the film forming apparatus to be used in the method of manufacturing a photoelectric conversion element according to this embodiment.

In the example given above, the first film forming chamber 61 includes the first cathode 71 and the second cathode 72, which are connected to high-frequency power sources, and the first anode 51, which is grounded, the first cathode 71 and the second cathode 72 are placed at two ends in the first film forming chamber 61, the first anode 51 is placed between the first cathode 71 and the second cathode 72, and the other film forming chambers described above with reference to FIG. 4 and FIG. 9 are the same as the first film forming chamber 61 in components and arrangement of the components. The present disclosure, however, is not limited to this example. For instance, a configuration illustrated as an example in FIG. 10 may be employed in which a film forming chamber 67 includes an anode electrode 56 placed at one end of the film forming chamber 67, and a first cathode 71A and a second cathode 72A, which are placed at the other end of the film forming chamber 67 so as to face the anode 56, in separate areas. In this case as well, a first film forming place 81A is defined between the first cathode 71A and the anode 56, and a second film forming place 82A is defined between the second cathode 72A and the anode 56. When different film forming conditions are to be set to the first film forming place 81A and the second film forming place 82A, however, a preferred configuration is one in which the two cathodes are placed at the two ends of the film forming chamber and the two film forming places are partitioned by the anode as in the example described above with reference to FIG. 4 and FIG. 9.

In the example given in this embodiment, the step of forming the first intrinsic semiconductor layer, in which the first intrinsic semiconductor layer 5A is formed on the front side of each semiconductor substrate 1, the step of forming the first-conductivity-type semiconductor layer, in which the P-type semiconductor layer 3 as the first-conductivity-type semiconductor layer is formed on the front side of the first intrinsic semiconductor layer 5A, the step of passing through the third film forming chamber, and the transportation step and the inversion step are followed by the execution of the step of forming the second intrinsic semiconductor layer, in which the second intrinsic semiconductor layer 5B is formed on the back side of each semiconductor substrate 1, the step of passing through the second film forming chamber, and the step of forming the second-conductivity-type semiconductor layer, in which the N-type semiconductor layer 4 as the second-conductivity-type semiconductor layer is formed on the back side of the second intrinsic semiconductor layer 5B. The present disclosure, however, is not limited to this method. An alternative example is described below with reference to FIG. 4 and FIG. 9.

[Step of Placing First Semiconductor Substrates in First Film Forming Place of First Film Forming Chamber]

First, the semiconductor substrates 1 on each of which no desired thin film is formed on the front side and the back side are mounted on the substrate mounting surface of the first holder 31, with the front side of each semiconductor substrate 1 exposed. The semiconductor substrates 1 are then carried, while being mounted on the substrate holder 200, into the first film forming chamber 61 illustrated in FIG. 4 and FIG. 9 to be placed in the first film forming place 81.

[Step of Forming First Intrinsic Semiconductor Layer]

A step of forming a first intrinsic semiconductor layer, in which the first intrinsic semiconductor layer 5A is formed on the front side of each semiconductor substrate 1, is executed next. Specifically, the interior of the first film forming chamber 61 is vacuumized, a silicon-containing gas serving as a raw material gas, and others, are then supplied from the first cathode 71, which is a showerhead electrode, and the first high-frequency power source 91 is turned on, to thereby cause plasma discharge in the first film forming place 81. With the thus-caused plasma discharge, the raw material gas is ionized to form the first intrinsic semiconductor layer 5A on the front surface of each semiconductor substrate 1 that is the first semiconductor substrate.

[Step of Passing Through Second Film Forming Chamber]

The substrate holder 200 is then carried into the second film forming chamber 62. However, the semiconductor substrates 1 pass therethrough without a film being formed on the front side of each semiconductor substrate 1 in the third film forming place 83 in the second film forming chamber 62.

[Step of Forming First-Conductivity-Type Semiconductor Layer]

The substrate holder 200 is next carried into the third film forming chamber 63 in order to execute a step of forming a first-conductivity-type semiconductor layer, in which the first-conductivity-type semiconductor layer is formed on the front side of the first intrinsic semiconductor layer 5A. In this example, the first-conductivity-type semiconductor layer is formed in the third film forming chamber 63. Specifically, the semiconductor substrates 1 are placed in the fifth film forming place 85, the interior of the third film forming chamber 63 is vacuumized, a silicon-containing gas serving as a raw material gas, a dopant addition gas, and others are then supplied from the fifth cathode 75, which is a showerhead electrode, and the fifth high-frequency power source 95 is turned on, to thereby cause plasma discharge in the fifth film forming place 85. With the thus-caused plasma discharge, the raw material gas and the dopant addition gas are ionized to form the P-type semiconductor layer 3 as the first-conductivity-type semiconductor layer on the front side of the first intrinsic semiconductor layer 5A.

[Transportation Step and Inversion Step]

After the substrate holder 200 passes through the third film forming chamber 63, a transportation step is executed in which the substrate holder 200 is carried into the first film forming chamber 61 again by the transportation means 64 described above.

At this point, the first intrinsic semiconductor layer 5A and the P-type semiconductor layer 3 have been formed on the front side of each of the semiconductor substrates 1 that have passed through the third film forming chamber 63.

In this example, the semiconductor substrate 1 with a desired thin film formed on the front side as this one is referred to as a "second semiconductor substrate".

An inversion step is executed next to flip the semiconductor substrates 1 having been mounted on the first holder 31 with the front side exposed, so that the semiconductor substrates 1 are mounted on the substrate mounting surface of the second holder 32 with the back side of each semiconductor substrate 1 exposed.

In this example, new first semiconductor substrates with a desired thin film not formed on both of the front side and the back side are further mounted on the substrate mounting surface of the first holder 31, which is now free as a result of moving the second semiconductor substrates to the second holder 32, in a manner that exposes the front side of each new first semiconductor substrate.

It does not matter which of the transportation step and the inversion step is executed first. Further, as an alternative method, the inversion step may be executed in the middle of the transportation step.

[Step of Placing Second Semiconductor Substrates in Second Film Forming Place of First Film Forming Chamber]

Once the second semiconductor substrates are mounted on the substrate mounting surface of the second holder 32 and the first semiconductor substrates are mounted on the substrate mounting surface of the first holder 31, the substrate holder 200 is carried into the first film forming chamber 61 again. In the first film forming chamber 61, the first holder 31 and the second holder 32 are electrically connected to the first anode 51, the first holder 31 is placed in the first film forming place 81 described above, and the second holder 32 is placed in the second film forming place 82 described above.

[Step of Forming Second Intrinsic Semiconductor Layer]

Once the first semiconductor substrates are placed in the first film forming place 81 and the second semiconductor substrates are placed in the second film forming place 82, the door of the first film forming chamber 61 is closed and the interior of the first film forming chamber 61 is vacuumized. A silicon-containing gas serving as a raw material gas, and others, are then supplied from the first cathode 71 and the second cathode 72, which are showerhead electrodes.

The first high-frequency power source 91 connected to the first cathode 71 is then turned on, to thereby cause plasma discharge between the first cathode 71 and the first anode 51. The second high-frequency power source 92 connected to the second cathode 72 is also turned on, to thereby cause plasma discharge between the second cathode 72 and the first anode 51. With the thus-caused plasma discharge, the $SiH_4$ gas serving as a raw material gas and the $H_2$ gas are ionized to form an intrinsic amorphous silicon layer as the first intrinsic semiconductor layer 5A on the front surface of each of the semiconductor substrates 1 that are the first semiconductor substrates mounted on the first holder 31, and to form an intrinsic amorphous silicon layer as the second intrinsic semiconductor layer 5B on the back surface of each of the semiconductor substrates 1 that are the second semiconductor substrates mounted on the second holder 32.

The step of forming the first intrinsic semiconductor layer and the step of forming the second intrinsic semiconductor layer described above are executed in the same period.

This method does not require separate film forming chambers for forming a desired thin film (intrinsic semiconductor layer in this embodiment) on the back side of each semiconductor substrate 1 and for forming a thin film on the front side of each semiconductor substrate 1 with the use of a raw material gas common to the desired thin film, and accordingly accomplishes the downsizing of an inline manufacturing apparatus.

In addition, an inline manufacturing process high in productivity is realized because the step of forming the second intrinsic semiconductor layer and the step of forming the first intrinsic semiconductor layer described above can be executed in the same period.

[Step of Forming Second-Conductivity-Type Semiconductor Layer]

Once the second intrinsic semiconductor layer 5B is formed on the back surface of each second semiconductor substrate, the substrate holder 200 is moved into the second film forming chamber 62. In this example, the second-conductivity-type semiconductor layer is formed in the second film forming chamber 62. In the second film forming chamber 62, the first holder 31 and the second holder 32 are electrically connected to the second anode 52, the first holder 31 is placed in the third film forming place 83 described above, and the second holder 32 is placed in the fourth film forming place 84 described above. The door of the second film forming chamber 62 is then closed, and the interior of the second film forming chamber 62 is vacuumized. Subsequently, $SiH_4$ gas as a raw material gas, $H_2$ gas, and $PH_3$ gas, which is diluted with hydrogen as a dopant addition gas, are supplied to the fourth film forming place 84 in the second film forming chamber 62, from the fourth cathode 74, which is a showerhead electrode. Only a minute amount of dopant impurity is required to be added, and a mixture gas diluted with $SiH_4$ and $H_2$ in advance may therefore be used.

In this embodiment, a heater built in the second anode 52 is used to heat the second semiconductor substrates mounted on the second holder 32, and the fourth high-frequency power source 94 is turned on, to thereby cause plasma discharge between the fourth cathode 74 and the second anode 52. With the thus-caused plasma discharge, the N-type semiconductor layer 4 as a second-conductivity-type semiconductor layer is formed on the back side of the second intrinsic semiconductor layer 5B.

The step of forming the second-conductivity-type semiconductor layer may be executed in the same period as that during which the step of passing through the second film forming chamber described above is executed. Specifically, the N-type semiconductor layer 4 can be formed on the back surface of the second intrinsic semiconductor layer 5B, which has been formed on the back side of each second semiconductor substrate, in the fourth film forming place 84 by turning on the fourth high-frequency power source 94 connected to the fourth cathode 74 and by supplying gases from the fourth cathode 74, which is a showerhead electrode, while keeping the third high-frequency power source 93 connected to the third cathode 73, turned off to maintain the state in which no film is formed on the first semiconductor substrates mounted on the first holder 31 in the third film forming place 83.

[Step of Passing Through Third Film Forming Chamber]

Once the N-type semiconductor layer 4 is formed on the back side of the second intrinsic semiconductor layer 5B, the door of the second film forming chamber 62 is opened to move the substrate holder 200 into the third film forming chamber 63. In the third film forming chamber 63, the first holder 31 and the second holder 32 are electrically connected to the third anode 53, the first holder 31 is placed in the fifth film forming place 85 described above, and the second holder 32 is placed in the sixth film forming place 86 described above.

In this example, the third film forming chamber 63 is a film forming chamber in which the P-type semiconductor layer 3 is formed, and the P-type semiconductor layer 3 is not to be formed on the back side of the N-type semiconductor layer 4. The semiconductor substrates 1 that are mounted on the second holder 32 placed in the sixth film forming place 86 therefore pass through the third film forming chamber 63 without any film being formed on the semiconductor substrates 1. That is, in the step of passing through the third film forming chamber, the sixth high-frequency power source 96 connected to the sixth cathode 76 is turned off so that no film is formed on the semiconductor substrates 1 mounted on the second holder 32. In this state, it is also possible to stop gas supply from the sixth cathode 76, which is a showerhead electrode. When the fifth cathode 75 and the sixth cathode 76 are connected to a shared gas cylinder, an electromagnetic valve may be used to stop only gas supply to the sixth cathode 76.

The step of passing through the third film forming chamber may be executed in the same period as that during which the step of forming the first-conductivity-type semiconductor layer described above is executed. That is, the P-type semiconductor layer 3 can be formed on the front surface of the first intrinsic semiconductor layer 5A, which has been formed on the front side of each first semiconductor substrate, in the fifth film forming place 85 by turning on the fifth high-frequency power source 95 connected to the fifth cathode 75 and by supplying gases from the fifth cathode 75, which is a showerhead electrode, while keeping the sixth high-frequency power source 96 connected to the sixth cathode 76, turned off to maintain the state in which no film is formed on the second semiconductor substrates mounted on the second holder 32 in the sixth film forming place 86.

The step of forming the transparent conductive layer and the step of forming the collecting electrode, which are described above with reference to FIG. 9, may be executed after the step of passing through the third film forming chamber.

The description given above on this embodiment takes as an example a method in which the first-conductivity-type semiconductor is a P-type semiconductor and the second-conductivity-type semiconductor is an N-type semiconductor. However, a method in which the first-conductivity-type semiconductor is an N-type semiconductor and the second-conductivity-type semiconductor is a P-type semiconductor may be employed.

The manufacturing method according to this embodiment described above may be modified by switching the front side and back side of each semiconductor substrate 1 in every step. That is, a manufacturing method may be employed in which a film is formed on the non-light receiving-surface side (back side) of each first semiconductor substrate and a film is formed on the light receiving-surface side (front side) of each second semiconductor substrate in, for example, the first film forming chamber 61, the second film forming chamber 62, and the third film forming chamber 63.

In the example described in this embodiment, gases are supplied from the cathode side in each film forming chamber. Another manufacturing method may be employed in which the anode is a showerhead electrode, and gases are supplied from the anode side into the film forming chamber.

In the examples of this embodiment illustrated in FIG. 4 and FIG. 9, two cathodes connected to high-frequency power sources are placed at two ends of each film forming chamber, and an anode is placed between the two cathodes. However, as another example, two anodes may be placed at two ends of each film forming chamber, with a cathode placed between the anodes. In this case, the cathode placed in the middle is connected to a high-frequency power source, and plasma discharge may be caused between one anode and the cathode, and between the other anode and the cathode.

In the configuration example of the substrate holder 200 of this embodiment that is illustrated in FIG. 3, the substrate mounting surface of the first holder 31 and the substrate mounting surface of the second holder 32 face directions opposite from each other. However, the first holder 31 and the second holder 32 may be arranged so that their substrate mounting surfaces face each other. In this case, the first holder 31 and the second holder 32 are distanced from each other in the substrate holder 200 to create some gap from the electrode that is placed between the first holder 31 and the second holder 32 when the substrate holder 200 is carried into each film forming chamber, to the substrate mounting surfaces of the first holder 31 and the second holder 32.

When the first holder 31 and the second holder 32 are arranged so that their substrate mounting surfaces face each other in the substrate holder 200, a plurality of holes may be formed in areas of the first holder 31 and the second holder 32 in which the semiconductor substrates 1 are not mounted, in order to make it easy for a gas to reach the substrate mounting surfaces located on the inner side of the substrate holder 200.

Example 3

Example 3 is an example related to the second aspect of the invention of the present disclosure.

In the example given in this embodiment, the step of forming the first intrinsic semiconductor layer, in which the first intrinsic semiconductor layer 5A is formed on the front side of each semiconductor substrate 1, and the step of forming the first-conductivity-type semiconductor layer, in which the P-type semiconductor layer 3 as the first-conductivity-type semiconductor layer is formed on the front side of the first intrinsic semiconductor layer 5A are followed by the execution of the step of forming the second intrinsic semiconductor layer, in which the second intrinsic semiconductor layer 5B is formed on the back side of each semiconductor substrate 1, and the step of forming the second-conductivity-type semiconductor layer, in which the N-type semiconductor layer 4 as the second-conductivity-type semiconductor layer is formed on the back side of the second intrinsic semiconductor layer 5B. The present disclosure, however, is not limited to this method. An alternative example is described below with reference to FIG. 4 and FIG. 9.

[Step of Placing First Semiconductor Substrates in Second Film Forming Place of First Film Forming Chamber]

First, the semiconductor substrates 1 on each of which no desired thin film is formed on the front side and the back side are mounted on the substrate mounting surface of the second holder 32, with the back side of each semiconductor substrate 1 exposed. The semiconductor substrates 1 are then carried, while being mounted on the substrate holder 200, into the first film forming chamber 61 illustrated in FIG. 4 and FIG. 9 to be placed in the second film forming place 82.

[Step of Forming Second Intrinsic Semiconductor Layer]

A step of forming the second intrinsic semiconductor layer, in which the second intrinsic semiconductor layer 5B is formed on the back side of each semiconductor substrate 1, is executed next. Specifically, the interior of the first film forming chamber 61 is vacuumized, a silicon-containing gas serving as a raw material gas, and others, are then supplied from the second cathode 72, which is a showerhead electrode, and the second high-frequency power source 92 is turned on, to thereby cause plasma discharge in the second film forming place 82. With the thus-caused plasma discharge, the raw material gas is ionized to form the second intrinsic semiconductor layer 5B on the back surface of each semiconductor substrate 1 that is the first semiconductor substrate.

[Step of Passing Through Second Film Forming Chamber]

The substrate holder 200 is then carried into the second film forming chamber 62. However, the semiconductor substrates 1 pass therethrough without a film being formed on the back side of each semiconductor substrate 1 in the fourth film forming place 84 in the second film forming chamber 62.

[Step of Forming Second-Conductivity-Type Semiconductor Layer]

The substrate holder 200 is next carried into the third film forming chamber 63 in order to execute a step of forming a second-conductivity-type semiconductor layer in which the second-conductivity-type semiconductor layer is formed on the back side of the second intrinsic semiconductor layer 5B. Specifically, the semiconductor substrates 1 are placed in the sixth film forming place 86, the interior of the third film forming chamber 63 is vacuumized, a silicon-containing gas serving as a raw material gas, a dopant addition gas, and others are then supplied from the sixth cathode 76, which is a showerhead electrode, and the sixth high-frequency power source 96 is turned on, to thereby cause plasma discharge in the sixth film forming place 86. With the thus-caused plasma discharge, the raw material gas and the dopant addition gas are ionized to form the second-conductivity-type semiconductor layer on the back side of the second intrinsic semiconductor layer 5B.

[Transportation Step and Inversion Step]

After the substrate holder 200 passes through the third film forming chamber 63, a transportation step is executed in which the substrate holder 200 is carried into the first film forming chamber 61 again by the transportation means 64 described above.

An inversion step is executed next to flip the semiconductor substrates 1 having been mounted on the second holder 32 with the back side exposed, so that the semiconductor substrates 1 are mounted on the substrate mounting surface of the first holder 31 with the front side of each semiconductor substrate 1 exposed.

It does not matter which of the transportation step and the inversion step is executed first. Further, as an alternative method, the inversion step may be executed in the middle of the transportation step.

[Step of Forming First Intrinsic Semiconductor Layer]

The substrate holder 200 is next carried into the first film forming chamber 61 in order to execute a step of forming a first intrinsic semiconductor layer, in which the first intrinsic semiconductor layer 5A is formed on the front side of each semiconductor substrate 1. Specifically, the semiconductor substrates 1 are placed in the first film forming place 81, the interior of the first film forming chamber 61 is vacuumized, a silicon-containing gas serving as a raw material gas, and others are then supplied from the first cathode 71, which is a showerhead electrode, and the first high-frequency power source 91 is turned on, to thereby cause plasma discharge in the first film forming place 81. With the thus-caused plasma discharge, the raw material gas is ionized to form the first intrinsic semiconductor layer 5A on the front surface of each semiconductor substrate 1.

[Step of Forming First-Conductivity-Type Semiconductor Layer]

The substrate holder 200 is next carried into the second film forming chamber 62 in order to execute a step of forming a first-conductivity-type semiconductor layer, in which the first-conductivity-type semiconductor layer is formed on the front side of the first intrinsic semiconductor layer 5A. Specifically, the semiconductor substrates 1 are placed in the third film forming place 83, the interior of the second film forming chamber 62 is vacuumized, a silicon-containing gas serving as a raw material gas, a dopant addition gas, and others are then supplied from the third cathode 73, which is a showerhead electrode, and the third high-frequency power source 93 is turned on, to thereby cause plasma discharge in the third film forming place 83. With the thus-caused plasma discharge, the raw material gas and the dopant addition gas are ionized to form the first-conductivity-type semiconductor layer on the front side of the first intrinsic semiconductor layer 5A.

[Step of Passing Through Third Film Forming Chamber]

The substrate holder 200 is then carried into the third film forming chamber 63. However, the semiconductor substrates 1 pass therethrough without a film being formed on the front side of each semiconductor substrate 1 in the fifth film forming place 85 in the third film forming chamber 63.

A manufacturing method may be also employed in which the step of forming the first intrinsic semiconductor layer and the step of forming the first-conductivity-type semiconductor layer are thus executed after executing the step of forming the second intrinsic semiconductor layer and the step of forming the second-conductivity-type semiconductor layer first.

The step of forming the transparent conductive layer and the step of forming the collecting electrode, which are described above with reference to FIG. 9, may be executed after the step of passing through the third film forming chamber.

The first conductivity type and the second conductivity type, which are the P type and the N type, respectively, in the description of this embodiment, may be the N type and the P type, respectively.

In the example given in this embodiment, each film forming chamber has two film forming places as illustrated in FIG. 4 and FIG. 9, the substrate holder 200 includes the first holder 31 and the second holder 32, the first holder 31 is placed in one of the film forming places in the film forming chamber, and the second holder 32 is placed in the other of the film forming places in the film forming chamber. However, the present disclosure is not limited to this method. A description is given below with reference to FIG. 11 on a manufacturing method that is used when a substrate holder includes only a first holder 31A, and each film forming chamber included in a film forming apparatus 300B has one film forming place.

Figure 11:
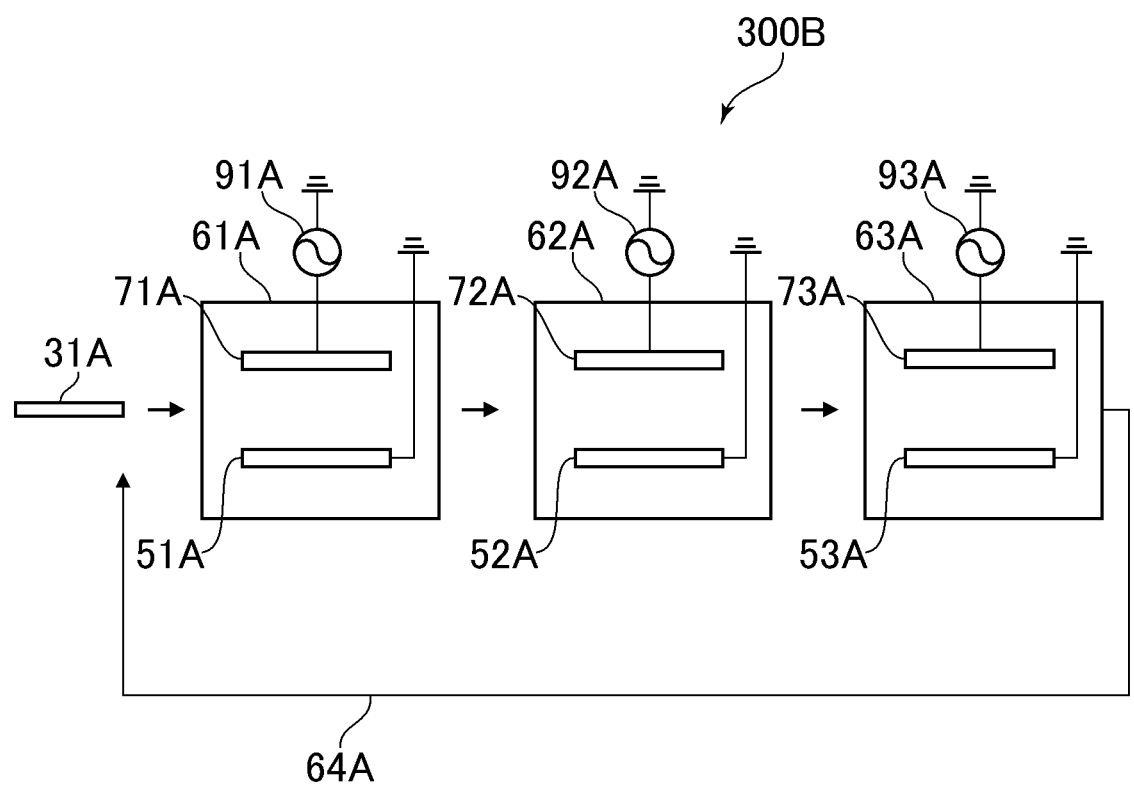
FIG. 11 is a schematic top view for illustrating Example 3 of the film forming apparatus to be used in the method of manufacturing a photoelectric conversion element according to this embodiment.

As illustrated in FIG. 11, the film forming apparatus 300B is an inline plasma CVD apparatus including a first film forming chamber 61A, a second film forming chamber 62A, and a third film forming chamber 63A, which are connected in series, and the substrate holder carried into the first film forming chamber 61A is accordingly transported in a direction toward the third film forming chamber 63A in order. The film forming apparatus 300B further includes transportation means 64A for returning the first holder 31A from the third film forming chamber 63A to the first film forming chamber 61A, and the semiconductor substrates 1 that have undergone a film forming process in the third film forming chamber 63A are subjected to a film forming process in the first film forming chamber 61A again. Another film forming chamber may be interposed between two of the film forming chambers.

The first film forming chamber 61A is a film forming chamber in which an intrinsic semiconductor layer is formed. The first film forming chamber 61A includes a first cathode 71A connected to a first high-frequency power source 91A, and a first anode 51A, which is placed so as to face the first cathode 71A, and is grounded. When the first high-frequency power source 91A is turned on, plasma discharge is caused between the first cathode 71A and the first anode 51A. The first cathode 71A is a showerhead electrode, and has gas inlets through which a raw material gas and others are supplied.

The second film forming chamber 62A is a film forming chamber in which a first-conductivity-type semiconductor layer is formed. The second film forming chamber 62A includes a second cathode 72A connected to a second high-frequency power source 92A, and a second anode 52A, which is placed so as to face the second cathode 72A, and is grounded. When the second high-frequency power source 92A is turned on, plasma discharge is caused between the second cathode 72A and the second anode 52A. The second cathode 72A is a showerhead electrode, and has gas inlets through which a raw material gas, a dopant additive gas, and others are supplied.

The third film forming chamber 63A is a film forming chamber in which a second-conductivity-type semiconductor layer is formed. The third film forming chamber 63A includes a third cathode 73A connected to a third high-frequency power source 93A, and a third anode 53A, which is placed so as to face the third cathode 73A, and is grounded. When the third high-frequency power source 93A is turned on, plasma discharge is caused between the third cathode 73A and the third anode 53A. The third cathode 73A is a showerhead electrode, and has gas inlets through which a raw material gas, a dopant additive gas, and others are supplied.

[Step of Placing First Semiconductor Substrates in First Film Forming Place of First Film Forming Chamber]

The semiconductor substrates 1 with no intrinsic semiconductor layer formed on both of the front side and the back side are prepared first. The semiconductor substrates 1 are mounted on a substrate mounting surface of the first holder 31A so that the front side of each semiconductor substrate 1 is exposed. That is, the semiconductor substrates 1 are mounted on the first holder 31A with the back surface of each semiconductor substrate 1 facing the first holder 31A.

The first holder 31A is then carried into the first film forming chamber 61A. At this point, the first holder 31A is placed so that the substrate mounting surface of the first holder 31A faces the first cathode 71A across a gap.

[Step of Forming First Intrinsic Semiconductor Layer]

The first holder 31A is next carried into the first film forming chamber 61A in order to execute a step of forming a first intrinsic semiconductor layer, in which the first intrinsic semiconductor layer 5A is formed on the front side of each semiconductor substrate 1. Specifically, the interior of the first film forming chamber 61A in which the semiconductor substrates 1 are placed is vacuumized, a silicon-containing gas serving as a raw material gas, and others, are then supplied from the first cathode 71A, which is a showerhead electrode, and the first high-frequency power source 91A is turned on, to thereby cause plasma discharge in the first film forming chamber 61A. With the thus-caused plasma discharge, the raw material gas is ionized to form the first intrinsic semiconductor layer 5A on the front surface of each semiconductor substrate 1.

[Step of Forming First-Conductivity-Type Semiconductor Layer]

The first holder 31A is then carried into the second film forming chamber 62A in order to execute a step of forming a first-conductivity-type semiconductor layer, in which the first-conductivity-type semiconductor layer is formed on the front side of the first intrinsic semiconductor layer 5A. Specifically, the interior of the second film forming chamber 62A in which the semiconductor substrates 1 are placed is vacuumized, a silicon-containing gas serving as a raw material gas, a dopant additive gas, and others, are then supplied from the second cathode 72A, which is a showerhead electrode, and the second high-frequency power source 92A is turned on, to thereby cause plasma discharge in the second film forming chamber 62A. With the thus-caused plasma discharge, the raw material gas and the dopant additive gas are ionized to form the first-conductivity-type semiconductor layer on the front side of the first intrinsic semiconductor layer 5A.

[Step of Passing Through Third Film Forming Chamber]

The first holder 31A is next carried into the third film forming chamber 63A. In the third film forming chamber 63A, however, the third high-frequency power source 93A is turned off and the semiconductor substrates 1 pass therethrough without a film being formed on the front side of each semiconductor substrate 1.

[Transportation Step and Inversion Step]

After the first holder 31A passes through the third film forming chamber 63A, a transportation step is executed, in which the first holder 31A is carried into the first film forming chamber 61A again by the transportation means 64A described above.

An inversion step is then executed to flip the semiconductor substrates 1 that have been mounted on the substrate mounting surface of the first holder 31A with the front side exposed, so that the semiconductor substrates 1 are mounted on the substrate mounting surface of the first holder 31A with the back side of each semiconductor substrate 1 exposed.

It does not matter which of the transportation step and the inversion step is executed first. Further, as an alternative method, the inversion step may be executed in the middle of the transportation step.

[Step of Forming Second Intrinsic Semiconductor Layer]

A step of forming a second intrinsic semiconductor layer, in which the second intrinsic semiconductor layer 5B is formed on the back side of each semiconductor substrate 1, is executed next. Specifically, the interior of the first film forming chamber 61A is vacuumized, a silicon-containing gas serving as a raw material gas, and others, are then supplied from the first cathode 71A, which is a showerhead electrode, and the first high-frequency power source 91A is turned on, to thereby cause plasma discharge in the first film forming chamber 61A. With the thus-caused plasma discharge, the raw material gas is ionized to form the second intrinsic semiconductor layer 5B on the back surface of each semiconductor substrate 1.

[Step of Passing Through Second Film Forming Chamber]

The first holder 31A is next carried into the second film forming chamber 62A. In the second film forming chamber 62A, however, the second high-frequency power source 92A is turned off and the semiconductor substrates 1 pass therethrough without a film being formed on the back side of each semiconductor substrate 1.

[Step of Forming Second-Conductivity-Type Semiconductor Layer]

The first holder 31A is then carried into the third film forming chamber 63A in order to execute a step of forming a second-conductivity-type semiconductor layer, in which the second-conductivity-type semiconductor layer is formed on the back side of the second intrinsic semiconductor layer 5B. Specifically, the interior of the third film forming chamber 63A in which the semiconductor substrates 1 are placed is vacuumized, a silicon-containing gas serving as a raw material gas, a dopant additive gas, and others, are then supplied from the third cathode 73A, which is a showerhead electrode, and the third high-frequency power source 93A is turned on, to thereby cause plasma discharge in the third film forming chamber 63A. With the thus-caused plasma discharge, the raw material gas and the dopant additive gas are ionized to form the second-conductivity-type semiconductor layer on the back side of the second intrinsic semiconductor layer 5B.

This manufacturing method enables the film forming apparatus 300B illustrated in FIG. 11, in which each film forming chamber has only one film forming place, to execute the step of forming the first intrinsic semiconductor layer and the step of forming the second intrinsic semiconductor layer described above in a shared film forming chamber, here, the first film forming chamber 61A. This means that an inline manufacturing process in which a downsized film forming apparatus is used to manufacture the photoelectric conversion element 100 is realized.

A manufacturing method in which the step of forming the first intrinsic semiconductor layer and the step of forming the first-conductivity-type semiconductor layer are executed after the step of forming the second intrinsic semiconductor layer and the step of forming the second-conductivity-type semiconductor layer may be employed also when the film forming apparatus 300B illustrated in FIG. 11 is used. An example thereof is described below.

First, the semiconductor substrates 1 are mounted on the substrate mounting surface of the first holder 31A so that the back side of each semiconductor substrate 1 is exposed.

Next, the step of forming the second intrinsic semiconductor layer, in which the second intrinsic semiconductor layer 5B is formed on the back side of each semiconductor substrate 1, is executed in the first film forming chamber 61A.

The step of passing through the second film forming chamber, in which the semiconductor substrates 1 pass through the second film forming chamber 62A, is then executed.

Next, the step of forming the second-conductivity-type semiconductor layer, in which the second-conductivity-type semiconductor layer is formed on the back side of the second intrinsic semiconductor layer 5B, is executed in the third film forming chamber 63A.

The transportation step and the inversion step are then executed with the use of the transportation means 64A to mount the semiconductor substrates 1 on the substrate mounting surface of the first holder 31A so that the front side of each semiconductor substrate 1 is exposed.

Next, the step of forming the first intrinsic semiconductor layer, in which the first intrinsic semiconductor layer 5A is formed on the front side of each semiconductor substrate 1, is executed in the first film forming chamber 61A.

The step of forming the first-conductivity-type semiconductor layer, in which the first-conductivity-type semiconductor layer is formed on the front side of the first intrinsic semiconductor layer 5A, is then executed in the second film forming chamber 62A.

The step of passing through the third film forming chamber, in which the semiconductor substrates 1 pass through the third film forming chamber 63A, is executed next.

The step of forming the transparent conductive layer and the step of forming the collecting electrode, which are described above with reference to FIG. 9, may be executed after the step of passing through the third film forming chamber.

Example 4

Example 4 is an example related to the third aspect of the invention of the present disclosure.

In the example given above, the film forming apparatus 300 described with reference to FIG. 4 and the film forming apparatus 300A described with reference to FIG. 9 include the transportation means 64 to execute the transportation step and the inversion step described above. The present disclosure, however, is not limited to this example. For instance, a method may be employed in which the first semiconductor substrates are mounted on the first holder 31 to undergo the step of forming the first intrinsic semiconductor layer, the step of forming the first-conductivity-type semiconductor layer, and the step of passing through the third film forming chamber in the first closed transportation path, the semiconductor substrates 1 thus turned into the second semiconductor substrates are stored, and the stored second semiconductor substrates are then mounted on the second holder 32 to undergo the step of forming the second intrinsic semiconductor layer, the step of passing through the second film forming chamber, and the step of forming the second-conductivity-type semiconductor layer in the second closed transportation path.

In the example given in this embodiment, the step of forming the first intrinsic semiconductor layer, in which the first intrinsic semiconductor layer 5A is formed on the front side of each semiconductor substrate 1, the step of forming the first-conductivity-type semiconductor layer, in which the P-type semiconductor layer 3 as the first-conductivity-type semiconductor layer is formed on the front side of the first intrinsic semiconductor layer 5A, the step of passing through the third film forming chamber, and the transportation step and the inversion step are followed by the execution of the step of forming the second intrinsic semiconductor layer, in which the second intrinsic semiconductor layer 5B is formed on the back side of each semiconductor substrate 1, the step of passing through the second film forming chamber, and the step of forming the second-conductivity-type semiconductor layer, in which the N-type semiconductor layer 4 as the second-conductivity-type semiconductor layer is formed on the back side of the second intrinsic semiconductor layer 5B. The present disclosure, however, is not limited to this method. An alternative example is described below with reference to FIG. 4 and FIG. 9.

[Step of Placing First Semiconductor Substrates in Second Film Forming Place of First Film Forming Chamber]

First, the semiconductor substrates 1 on each of which no desired thin film is formed on the front side and the back side are mounted on the substrate mounting surface of the second holder 32, with the back side of each semiconductor substrate 1 exposed. The semiconductor substrates 1 are then carried, while being mounted on the substrate holder 200, into the first film forming chamber 61 illustrated in FIG. 4 and FIG. 9 to be placed in the second film forming place 82. That is, the semiconductor substrates 1 are placed in the second closed transportation path with the back side exposed.

[Step of Forming Second Intrinsic Semiconductor Layer]

A step of forming a second intrinsic semiconductor layer, in which the second intrinsic semiconductor layer 5B is formed on the back side of each semiconductor substrate 1, is executed next. Specifically, the interior of the first film forming chamber 61 is vacuumized, a silicon-containing gas serving as a raw material gas, and others, are then supplied from the second cathode 72, which is a showerhead electrode, and the second high-frequency power source 92 is turned on, to thereby cause plasma discharge in the second film forming place 82. With the thus-caused plasma discharge, the raw material gas is ionized to form the second intrinsic semiconductor layer 5B on the back surface of each semiconductor substrate 1 that is the first semiconductor substrate.

[Step of Passing Through Second Film Forming Chamber]

A step of passing through the second film forming chamber is then executed. In this step, the semiconductor substrates 1 placed in the second closed transportation path pass through the second film forming chamber 62, which is a chamber for forming a first-conductivity-type film, under a state in which no film is to be formed on the back side of each semiconductor substrate 1. Specifically, the substrate holder 200 is carried into the second film forming chamber 62, but the fourth high-frequency power source 94 is turned off, so that the semiconductor substrates 1 pass therethrough without a film being formed on the back side of each semiconductor substrate 1 in the fourth film forming place 84 in the second film forming chamber 62.

[Step of Forming Second-Conductivity-Type Semiconductor Layer]

A step of forming a second-conductivity-type semiconductor layer is executed next to form the second-conductivity-type semiconductor layer on the back side of each of the semiconductor substrates 1 placed in the second closed transportation path. Specifically, the substrate holder 200 is carried into the third film forming chamber 63 in order to execute the step of forming the second-conductivity-type semiconductor layer, in which the second-conductivity-type semiconductor layer is formed on the back side of the second intrinsic semiconductor layer 5B. Specifically, the semiconductor substrates 1 are placed in the sixth film forming place 86, the interior of the third film forming chamber 63 is vacuumized, a silicon-containing gas serving as a raw material gas, a dopant addition gas, and others are then supplied from the sixth cathode 76, which is a showerhead electrode, and the sixth high-frequency power source 96 is turned on, to thereby cause plasma discharge in the sixth film forming place 86. With the thus-caused plasma discharge, the raw material gas and the dopant addition gas are ionized to form the second-conductivity-type semiconductor layer on the back side of the second intrinsic semiconductor layer 5B.

[Transportation Step and Inversion Step]

After the substrate holder 200 passes through the third film forming chamber 63, a transportation step is executed in which the substrate holder 200 is carried into the first film forming chamber 61 again by the transportation means 64 described above.

At this point, the second intrinsic semiconductor layer 5B and the N-type semiconductor layer 4 have been formed on the back side of each of the semiconductor substrates 1 that have passed through the third film forming chamber 63.

In this example, the semiconductor substrate 1 with a desired thin film formed on the back side as this one is referred to as a "second semiconductor substrate".

An inversion step is executed next to flip the semiconductor substrates 1 having been mounted on the second holder 32 with the back side exposed, so that the semiconductor substrates 1 are mounted on the substrate mounting surface of the first holder 31 with the front side of each semiconductor substrate 1 exposed.

The semiconductor substrate 1 placed in the second closed transportation path is thus moved to the first closed transportation path with the front side exposed, by executing the transportation step and the inversion step.

In this example, new first semiconductor substrates with a desired thin film not formed on both of the front side and the back side are further mounted on the substrate mounting surface of the second holder 32, which is now free as a result of moving the second semiconductor substrates to the first holder 31, in a manner that exposes the back side of the new first semiconductor substrates.

In short, the first semiconductor substrates are placed in the second closed transportation path with the back side exposed, and the second semiconductor substrates are placed in the first closed transportation path with the front side exposed.

It does not matter which of the transportation step and the inversion step is executed first. Further, as an alternative method, the inversion step may be executed in the middle of the transportation step.

[Step of Placing Second Semiconductor Substrates in First Film Forming Place of First Film Forming Chamber]

Once the second semiconductor substrates are mounted on the substrate mounting surface of the first holder 31 and the first semiconductor substrates are mounted on the substrate mounting surface of the second holder 32, the substrate holder 200 is carried into the first film forming chamber 61 again. In the first film forming chamber 61, the first anode 51 is placed between the first holder 31 and the second holder 32, the first holder 31 is placed in the first film forming place 81 described above, and the second holder 32 is placed in the second film forming place 82 described above.

[Step of Forming First Intrinsic Semiconductor Layer]

Once the first semiconductor substrates are placed in the second film forming place 82 and the second semiconductor substrates are placed in the first film forming place 81, the door of the first film forming chamber 61 is closed and the interior of the first film forming chamber 61 is vacuumized. A silicon-containing gas serving as a raw material gas, and others, are then supplied from the first cathode 71 and the second cathode 72, which are showerhead electrodes.

The first high-frequency power source 91 connected to the first cathode 71 is then turned on, to thereby cause plasma discharge between the first cathode 71 and the first anode 51. The second high-frequency power source 92 connected to the second cathode 72 is also turned on, to thereby cause plasma discharge between the second cathode 72 and the first anode 51. With the thus-caused plasma discharge, the $SiH_4$ gas serving as a raw material gas and the $H_2$ gas are ionized to form an intrinsic amorphous silicon layer as the first intrinsic semiconductor layer 5A on the front surface of each of the semiconductor substrates 1 that are the second semiconductor substrates mounted on the first holder 31, and to form an intrinsic amorphous silicon layer as the second intrinsic semiconductor layer 5B on the back surface of each of the semiconductor substrates 1 that are the first semiconductor substrates mounted on the second holder 32.

The step of forming the first intrinsic semiconductor layer and the step of forming the second intrinsic semiconductor layer described above are executed in the same period.

This method does not require separate film forming chambers for forming a desired thin film (intrinsic semiconductor layer in this embodiment) on the back side of each semiconductor substrate 1 and for forming a thin film on the front side of each semiconductor substrate 1 with the use of a raw material gas common to the desired thin film, and accordingly accomplishes the downsizing of an inline manufacturing apparatus.

In addition, an inline manufacturing process high in productivity is realized because the step of forming the second intrinsic semiconductor layer and the step of forming the first intrinsic semiconductor layer described above can be executed in the same period.

[Step of Forming First-Conductivity-Type Semiconductor Layer]

The first-conductivity-type semiconductor layer is formed next on the front side of each semiconductor substrate 1 placed in the first closed transportation path. Specifically, the substrate holder 200 is moved into the second film forming chamber 62, which is a chamber for forming a first-conductivity-type film, after the first intrinsic semiconductor layer 5A is formed on the front surface of each second semiconductor substrate. In the second film forming chamber 62, the second anode 52 is placed between the first holder 31 and the second holder 32, the first holder 31 is placed in the third film forming place 83 described above, and the second holder 32 is placed in the fourth film forming place 84 described above. The door of the second film forming chamber 62 is then closed, and the interior of the second film forming chamber 62 is vacuumized. Subsequently, $SiH_4$ gas as a raw material gas, $H_2$ gas, and $PH_3$ gas, which is diluted with hydrogen as a dopant addition gas, are supplied to the third film forming place 83 in the second film forming chamber 62, from the third cathode 73, which is a showerhead electrode. Only a minute amount of dopant impurity is required to be added, and a mixture gas diluted with $SiH_4$ and $H_2$ in advance may therefore be used.

In this embodiment, a heater built in the second anode 52 is used to heat the second semiconductor substrates mounted on the first holder 31, and the third high-frequency power source 93 is turned on, to thereby cause plasma discharge between the third cathode 73 and the second anode 52. With the thus-caused plasma discharge, the P-type semiconductor layer 3 as a first-conductivity-type semiconductor layer is formed on the front side of the first intrinsic semiconductor layer 5A.

The step of forming the first-conductivity-type semiconductor layer may be executed in the same period as that during which the step of passing through the second film forming chamber described above is executed. Specifically, the P-type semiconductor layer 3 can be formed on the front surface of the first intrinsic semiconductor layer 5A, which has been formed on the front side of each first semiconductor substrate, in the third film forming place 83 by turning on the third high-frequency power source 93 connected to the third cathode 73 and by supplying gases from the third cathode 73, which is a showerhead electrode, while keeping the fourth high-frequency power source 94 connected to the fourth cathode 74, turned off to maintain the state in which no film is formed on the first semiconductor substrates mounted on the second holder 32 in the fourth film forming place 84.

[Step of Passing Through Third Film Forming Chamber]

The semiconductor substrates 1 placed in the first closed transportation path next pass through the third film forming chamber 63, which is a chamber for forming a second-conductivity-type film, under a state in which no film is to be formed on the front side of each semiconductor substrate 1. Specifically, once the P-type semiconductor layer 3 is formed on the front side of the first intrinsic semiconductor layer 5A, the door of the second film forming chamber 62 is opened to move the substrate holder 200 into the third film forming chamber 63. In the third film forming chamber 63, the third anode 53 is placed between the first holder 31 and the second holder 32, the first holder 31 is placed in the fifth film forming place 85 described above, and the second holder 32 is placed in the sixth film forming place 86 described above.

In this embodiment, the third film forming chamber 63 is a film forming chamber in which the N-type semiconductor layer 4 is formed, and the N-type semiconductor layer 4 is not to be formed on the front side of the P-type semiconductor layer 3. The semiconductor substrates 1 that are mounted on the first holder 31 placed in the fifth film forming place 85 therefore pass through the third film forming chamber 63 without any film being formed on the semiconductor substrates 1. That is, in the step of passing through the third film forming chamber, the fifth high-frequency power source 95 connected to the fifth cathode 75 is turned off so that no film is formed on the semiconductor substrates 1 mounted on the first holder 31. In this state, it is also possible to stop gas supply from the fifth cathode 75, which is a showerhead electrode. When the fifth cathode 75 and the sixth cathode 76 are connected to a shared gas cylinder, an electromagnetic valve may be used to stop only gas supply to the fifth cathode 75.

The step of passing through the third film forming chamber may be executed in the same period as that during which the step of forming the second-conductivity-type semiconductor layer described above is executed. That is, the N-type semiconductor layer 4 can be formed on the back surface of the second intrinsic semiconductor layer 5B, which has been formed on the back side of each first semiconductor substrate, in the sixth film forming place 86 by turning on the sixth high-frequency power source 96 connected to the sixth cathode 76 and by supplying gases from the sixth cathode 76, which is a showerhead electrode, while keeping the fifth high-frequency power source 95 connected to the fifth cathode 75, turned off to maintain the state in which no film is formed on the second semiconductor substrates mounted on the first holder 31 in the fifth film forming place 85.

The step of forming the transparent conductive layer and the step of forming the collecting electrode, which are described above with reference to FIG. 9, may be executed after the step of passing through the third film forming chamber.

The description given above on this embodiment takes as an example a method in which the first-conductivity-type semiconductor is a P-type semiconductor and the second-conductivity-type semiconductor is an N-type semiconductor. However, a method in which the first-conductivity-type semiconductor is an N-type semiconductor and the second-conductivity-type semiconductor is a P-type semiconductor may be employed.

The manufacturing method according to this embodiment described above may be modified by switching the front side and backside of each semiconductor substrate 1 in every step. That is, a manufacturing method may be employed in which a film is formed on the non-light receiving-surface side (back side) of each first semiconductor substrate and a film is formed on the light receiving-surface side (front side) of each second semiconductor substrate in, for example, the first film forming chamber 61, the second film forming chamber 62, and the third film forming chamber 63.

Figure 12:
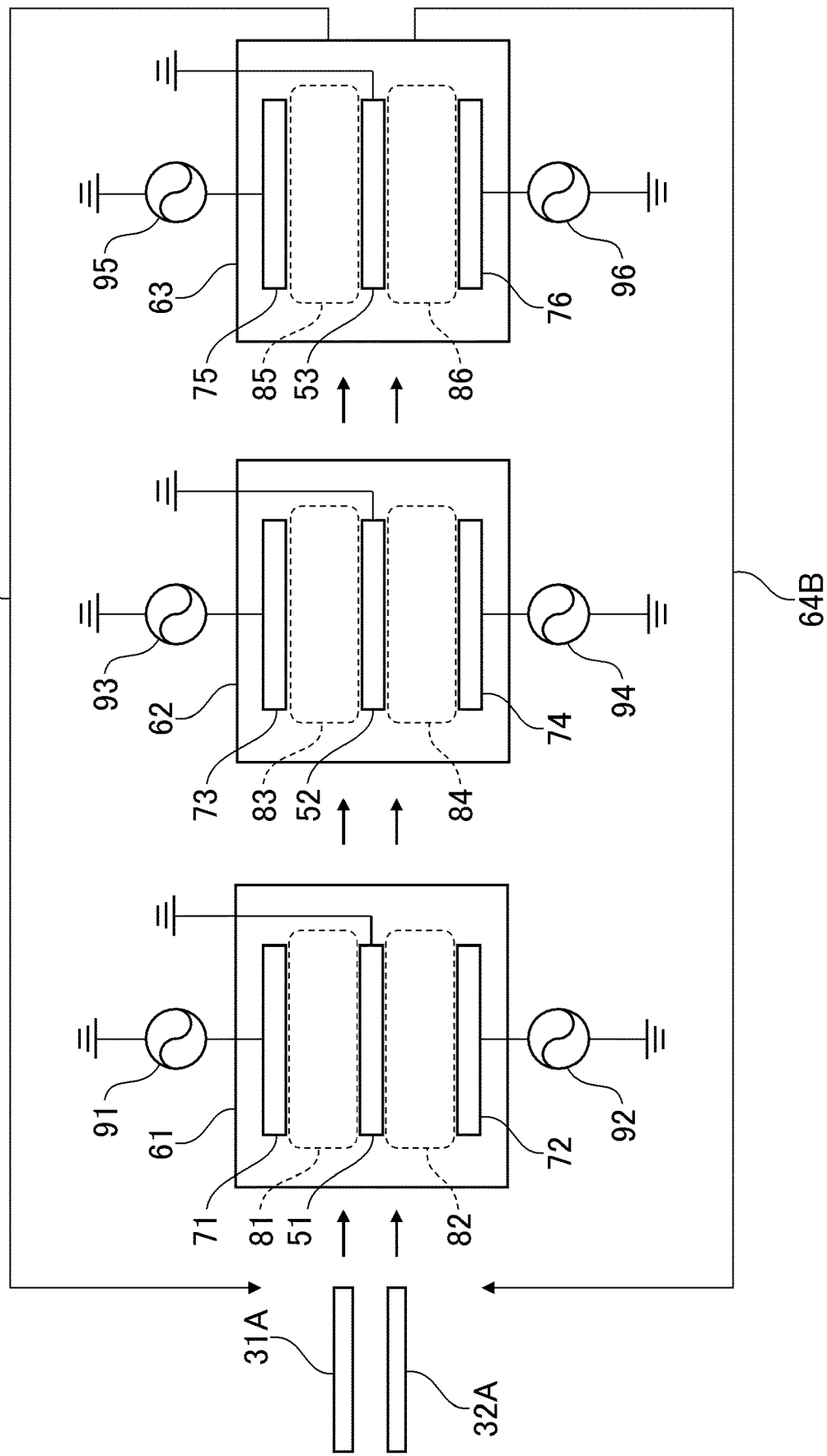
FIG. 12 is a schematic top view for illustrating Example 4 of the film forming apparatus to be used in the method of manufacturing a photoelectric conversion element according to this embodiment.

In the example of the substrate holder 200 described with reference to FIG. 3, the first holder 31 and the second holder 32 are held by the holding portion 33 to be integrated with each other. The present disclosure, however, is not limited to this example. For instance, a method may be employed in which a first holder 31A and a second holder 32A are configured as separate members as illustrated in FIG. 12, the first holder 31A is carried along a first closed transportation path in the film forming apparatus 300B to the first film forming place 81 of the first film forming chamber 61, the third film forming place 83 of the second film forming chamber 62, and the fifth film forming place 85 of the third film forming chamber 63, and the first holder 31A is then carried into the first film forming chamber 61 again by first transportation means 64A. In the method, the second holder 32A is carried along a second closed transportation path in the film forming apparatus 300B to the second film forming place 82 of the first film forming chamber 61, the fourth film forming place 84 of the second film forming chamber 62, and the sixth film forming place 86 of the third film forming chamber 63, and the second holder 32A is then carried into the first film forming chamber 61 again by second transportation means 64B.

In the case of forming films on the front side of each semiconductor substrate 1 first in the example described with reference to FIG. 12, the semiconductor substrates 1 to be carried into the first film forming chamber 61 from the third film forming chamber 63 by the first transportation means 64A may be removed from the first holder 31A to be mounted on the second holder 32A that is being carried by the second transportation means 64B so that the back side of each semiconductor substrate 1 is exposed. Further, in the case of forming films on the back side of each semiconductor substrate 1 first, the semiconductor substrates 1 to be carried into the first film forming chamber 61 from the third film forming chamber 63 by the second transportation means 64B may be removed from the second holder 32A to be mounted on the first holder 31A that is being carried by the first transportation means 64A so that the front side of each semiconductor substrate 1 is exposed.

The invention claimed is:

1. A method of manufacturing a photoelectric conversion element, the photoelectric conversion element having a first principal surface and a second principal surface, and including at least a first thin film, a semiconductor substrate, and a second thin film in this order,
   the method comprising a first placement step, a second placement step, a first film forming step, an inversion step, and a transportation step,
   wherein, in the first placement step, a first semiconductor substrate on which the first thin film and the second thin film are not formed is placed in a first film forming place in a first film forming chamber,
   wherein, in the second placement step, a second semiconductor substrate on which at least the first thin film is formed on the first-principal-surface side and the second thin film is not formed on the second-principal-surface side is placed in a second film forming place in the first film forming chamber,
   wherein, in the first film forming step, a step of forming the first thin film on the first-principal-surface side of the first semiconductor substrate and a step of forming the second thin film on the second-principal-surface side of the second semiconductor substrate are executed in the same period in the first film forming chamber,
   wherein, in the inversion step, the first-principal-surface side and the second-principal-surface side are inverted in the first semiconductor substrate that has undergone the first film forming step, and
   wherein, in the transportation step, the first semiconductor substrate that has undergone the first film forming step is carried into the first film forming chamber as the second semiconductor substrate.

2. The method of manufacturing a photoelectric conversion element according to claim 1, wherein the first thin film and the second thin film have a common composition.

3. The method of manufacturing a photoelectric conversion element according to claim 1, wherein the first thin film and the second thin film are formed by using a common raw material gas.

4. The method of manufacturing a photoelectric conversion element according to claim 1, wherein, in the first film forming step, a film forming condition under which the first thin film is formed in the first film forming place and a film forming condition under which the second thin film is formed in the second film forming place differ from each other.

5. The method of manufacturing a photoelectric conversion element according to claim 1, wherein the first thin film and the second thin film that are formed in the first film forming step are intrinsic semiconductor layers.

6. The method of manufacturing a photoelectric conversion element according to claim 1,
wherein the first film forming chamber includes a first cathode, a second cathode, and a first anode, the first anode being placed between the first cathode and the second cathode,
wherein, in the first placement step, the first semiconductor substrate is placed in the first film forming place so that the first-principal-surface side of the first semiconductor substrate faces the first cathode,
wherein, in the second placement step, the second semiconductor substrate is placed in the second film forming place so that the second-principal-surface side of the second semiconductor substrate faces the second cathode, and
wherein, in the first film forming step, plasma discharge is caused in the first film forming place and the second film forming place.

7. The method of manufacturing a photoelectric conversion element according to claim 1, wherein the first placement step and the second placement step are executed substantially concurrently.

8. The method of manufacturing a photoelectric conversion element according to claim 1, further comprising a third placement step, a fourth placement step, and a second film forming step,
wherein, in the third placement step, in a second film forming chamber connected in series to the first film forming chamber, the first semiconductor substrate is placed in a third film forming place in the second film forming chamber,
wherein, in the fourth placement step, in the second film forming chamber, the second semiconductor substrate is placed in a fourth film forming place in the second film forming chamber, and
wherein, in the second film forming step, in the second film forming chamber, no first-conductivity-type semiconductor layer is formed on the second-principal-surface side of the second thin film on the second semiconductor substrate, and the first-conductivity-type semiconductor layer is formed on the first-principal-surface side of the first thin film on the first semiconductor substrate.

9. The method of manufacturing a photoelectric conversion element according to claim 8,
wherein the second film forming chamber includes a third cathode, a fourth cathode, and a second anode, the second anode being placed between the third cathode and the fourth cathode,
wherein, in the third placement step, the first semiconductor substrate is placed in the third film forming place so that the first-principal-surface side of the first semiconductor substrate faces the third cathode,
wherein, in the fourth placement step, the second semiconductor substrate is placed in the fourth film forming place so that the second-principal-surface side of the second semiconductor substrate faces the fourth cathode, and
wherein, in the second film forming step, plasma discharge is caused in the third film forming place.

10. The method of manufacturing a photoelectric conversion element according to claim 9, wherein, in the second film forming step, a raw material gas used to form the first-conductivity-type semiconductor layer is not supplied in the fourth film forming place.

11. The method of manufacturing a photoelectric conversion element according to claim 8, wherein the third placement step and the fourth placement step are executed substantially concurrently.

12. The method of manufacturing a photoelectric conversion element according to claim 8, further comprising a fifth placement step, a sixth placement step, and a third film forming step,
wherein, in the fifth placement step, in a third film forming chamber connected in series to the second film forming chamber, the first semiconductor substrate is placed in a fifth film forming place in the third film forming chamber,
wherein, in the sixth placement step, in the third film forming chamber, the second semiconductor substrate is placed in a sixth film forming place in the third film forming chamber, and
wherein, in the third film forming step, in the third film forming chamber, no second-conductivity-type semiconductor layer is formed on the first-principal-surface side of the first-conductivity-type semiconductor layer on the first semiconductor substrate, and the second-conductivity-type semiconductor layer is formed on the second-principal-surface side of the second thin film on the second semiconductor substrate.

13. The method of manufacturing a photoelectric conversion element according to claim 12,
wherein the third film forming chamber includes a fifth cathode, a sixth cathode, and a third anode, the third anode being placed between the fifth cathode and the sixth cathode,
wherein, in the fifth placement step, the first semiconductor substrate is placed in the fifth film forming place so that the first-principal-surface side of the first semiconductor substrate faces the fifth cathode,
wherein, in the sixth placement step, the second semiconductor substrate is placed in the sixth film forming place so that the second-principal-surface side of the second semiconductor substrate faces the sixth cathode, and
wherein, in the third film forming step, plasma discharge is caused in the sixth film forming place.

14. The method of manufacturing a photoelectric conversion element according to claim 13, wherein, in the third film forming step, a raw material gas used to form the second-conductivity-type semiconductor layer is not supplied in the fifth film forming place.

15. The method of manufacturing a photoelectric conversion element according to claim 12, wherein the fifth placement step and the sixth placement step are executed substantially concurrently.

16. The method of manufacturing a photoelectric conversion element according to claim 1, further comprising a third placement step, a fourth placement step, and a second film forming step,
wherein, in the third placement step, in a second film forming chamber connected in series to the first film forming chamber, the first semiconductor substrate is placed in a third film forming place in the second film forming chamber,
wherein, in the fourth placement step, in the second film forming chamber, the second semiconductor substrate is placed in a fourth film forming place in the second film forming chamber, and
wherein, in the second film forming step, in the second film forming chamber, no second-conductivity-type semiconductor layer is formed on the first-principalsurface side of the first thin film on the first semiconductor substrate, and the second-conductivity-type semiconductor layer is formed on the second-principal-surface side of the second thin film on the second semiconductor substrate.

17. The method of manufacturing a photoelectric conversion element according to claim 16, further comprising a fifth placement step, a sixth placement step, and a third film forming step,
   wherein, in the fifth placement step, in a third film forming chamber connected in series to the second film forming chamber, the first semiconductor substrate is placed in a fifth film forming place in the third film forming chamber,
   wherein, in the sixth placement step, in the third film forming chamber, the second semiconductor substrate is placed in a sixth film forming place in the third film forming chamber, and
   wherein, in the third film forming step, in the third film forming chamber, no first-conductivity-type semiconductor layer is formed on the second-principal-surface side of the second-conductivity-type semiconductor layer on the second semiconductor substrate, and the first-conductivity-type semiconductor layer is formed on the first-principal-surface side of the first thin film on the first semiconductor substrate.

18. The method of manufacturing a photoelectric conversion element according to claim 12, further comprising a fourth film forming step,
   wherein, in the fourth film forming step, in a fourth film forming chamber connected in series to the third film forming chamber, a first transparent conductive layer is formed on the first-principal-surface side of the first-conductivity-type semiconductor layer on the first semiconductor substrate, and a second transparent conductive layer is formed on the second-principal-surface side of the second-conductivity-type semiconductor layer on the second semiconductor substrate.

19. The method of manufacturing a photoelectric conversion element according to claim 18, further comprising a fifth film forming step,
   wherein, in the fifth film forming step, in a fifth film forming chamber connected in series to the fourth film forming chamber, a first insulating film is formed on the first-principal-surface side of the first transparent conductive layer on the first semiconductor substrate, and a second insulating film is formed on the second-principal-surface side of the second transparent conductive layer on the second semiconductor substrate.

20. The method of manufacturing a photoelectric conversion element according to claim 1, wherein the second semiconductor substrate is the first semiconductor substrate on which the first thin film has been formed in the first film forming step.

21. A method of manufacturing a photoelectric conversion element, the photoelectric conversion element having a first principal surface and a second principal surface, and including at least a first-conductivity-type semiconductor layer, a first intrinsic semiconductor layer, a semiconductor substrate, a second intrinsic semiconductor layer, and a second-conductivity-type semiconductor layer in this order,
   the method using an inline film forming apparatus in which a plurality of film forming chambers are connected in series, and comprising the steps of:
      forming the first intrinsic semiconductor layer;
      forming the first-conductivity-type semiconductor layer;
      passing through a third film forming chamber;
      forming the second intrinsic semiconductor layer;
      passing through a second film forming chamber; and
      forming the second-conductivity-type semiconductor layer,
   the inline film forming apparatus including a first film forming chamber, the second film forming chamber, and the third film forming chamber in this order,
   wherein, in the step of forming the first intrinsic semiconductor layer, the first intrinsic semiconductor layer is formed on the first-principal-surface side of the semiconductor substrate in the first film forming chamber,
   wherein, in the step of forming the first-conductivity-type semiconductor layer, the first-conductivity-type semiconductor layer is formed on the first-principal-surface side of the first intrinsic semiconductor layer in the second film forming chamber,
   wherein, in the step of passing through the third film forming chamber, the semiconductor substrate passes through the third film forming chamber after the step of forming the first-conductivity-type semiconductor layer,
   wherein, in the step of forming the second intrinsic semiconductor layer, the second intrinsic semiconductor layer is formed on the second-principal-surface side of the semiconductor substrate in the first film forming chamber,
   wherein, in the step of passing through the second film forming chamber, the semiconductor substrate passes through the second film forming chamber after the step of forming the second intrinsic semiconductor layer, and
   wherein, in the step of forming the second-conductivity-type semiconductor layer, the second-conductivity-type semiconductor layer is formed on the second-principal-surface side of the second intrinsic semiconductor layer in the third film forming chamber.

22. The method of manufacturing a photoelectric conversion element according to claim 21,
   wherein the step of forming the second intrinsic semiconductor layer is a step that follows the step of passing through the third film forming chamber, and
   wherein the method further comprises:
      a transportation step, in which the semiconductor substrate is carried into the first film forming chamber; and
      an exposure step, in which the second-principal-surface side of the semiconductor substrate is exposed,
      the transportation step and the exposure step being executed in a time window that follows the step of passing through the third film forming chamber and that precedes the step of forming the second intrinsic semiconductor layer.

23. The method of manufacturing a photoelectric conversion element according to claim 21,
   wherein the step of forming the first intrinsic semiconductor layer is a step that follows the step of forming the second-conductivity-type semiconductor layer, and
   wherein the method further comprises:
      a transportation step, in which the semiconductor substrate is carried into the first film forming chamber; and
      an exposure step, in which the first-principal-surface side of the semiconductor substrate is exposed,
      the transportation step and the exposure step being executed in a time window that follows the step of forming the second-conductivity-type semiconductor layer and that precedes the step of forming the first intrinsic semiconductor layer.

24. The method of manufacturing a photoelectric conversion element according to claim 21,
wherein the second film forming chamber includes a cathode connected to a high-frequency power source, and an anode placed so as to face the cathode, and
wherein, in the step of passing through the second film forming chamber, the semiconductor substrate is placed between the cathode and the anode so that the second-principal-surface side of the semiconductor substrate faces the cathode, and the high-frequency power source is turned off.

25. The method of manufacturing a photoelectric conversion element according to claim 21,
wherein the third film forming chamber includes a cathode connected to a high-frequency power source, and an anode placed so as to face the cathode, and
wherein, in the step of passing through the third film forming chamber, the semiconductor substrate is placed between the cathode and the anode so that the first-principal-surface side of the semiconductor substrate faces the cathode, and the high-frequency power source is turned off.

26. The method of manufacturing a photoelectric conversion element according to claim 21,
wherein the first film forming chamber includes a first cathode connected to a first high-frequency power source, a second cathode connected to a second high-frequency power source, and a first anode placed between the first cathode and the second cathode,
wherein, in the step of forming the first intrinsic semiconductor layer, the semiconductor substrate is placed between the first cathode and the first anode so that the first-principal-surface side of the semiconductor substrate faces the first cathode, and the first high-frequency power source is turned on, and
wherein, in the step of forming the second intrinsic semiconductor layer, the semiconductor substrate is placed between the second cathode and the first anode so that the second-principal-surface side of the semiconductor substrate faces the second cathode, and the second high-frequency power source is turned on.

27. The method of manufacturing a photoelectric conversion element according to claim 21,
wherein the second film forming chamber includes a third cathode connected to a third high-frequency power source, a fourth cathode connected to a fourth high-frequency power source, and a second anode placed between the third cathode and the fourth cathode,
wherein, in the step of forming the first-conductivity-type semiconductor layer, the semiconductor substrate is placed between the third cathode and the second anode so that the first-principal-surface side of the semiconductor substrate faces the third cathode, and the third high-frequency power source is turned on, and
wherein, in the step of passing through the second film forming chamber, the semiconductor substrate is placed between the fourth cathode and the second anode so that the second-principal-surface side of the semiconductor substrate faces the fourth cathode, and the fourth high-frequency power source is turned off.

28. The method of manufacturing a photoelectric conversion element according to claim 21,
wherein the third film forming chamber includes a fifth cathode connected to a fifth high-frequency power source, a sixth cathode connected to a sixth high-frequency power source, and a third anode placed between the fifth cathode and the sixth cathode,
wherein, in the step of passing through the third film forming chamber, the semiconductor substrate is placed between the fifth cathode and the third anode so that the first-principal-surface side of the semiconductor substrate faces the fifth cathode, and the fifth high-frequency power source is turned off, and
wherein, in the step of forming the second-conductivity-type semiconductor layer, the semiconductor substrate is placed between the sixth cathode and the third anode so that the second-principal-surface side of the semiconductor substrate faces the sixth cathode, and the sixth high-frequency power source is turned on.

29. A method of manufacturing a photoelectric conversion element, the photoelectric conversion element having a first principal surface and a second principal surface, and including at least a first-conductivity-type semiconductor layer, a semiconductor substrate, and a second-conductivity-type semiconductor layer in this order,
the method using an inline film forming apparatus, and comprising the steps of:
forming the first-conductivity-type semiconductor layer;
passing through a second-conductivity-type film forming chamber;
passing through a first-conductivity-type film forming chamber; and
forming the second-conductivity-type semiconductor layer,
the inline film forming apparatus including a first closed transportation path, a second closed transportation path, the first-conductivity-type film forming chamber, and the second-conductivity-type film forming chamber,
the first closed transportation path being a closed path used to form the first-principal-surface side of the photoelectric conversion element,
the second closed transportation path being a closed path used to form the second-principal-surface side of the photoelectric conversion element,
a part of the first closed transportation path and a part of the second closed transportation path being placed in the first-conductivity-type film forming chamber,
another part of the first closed transportation path and another part of the second closed transportation path being placed in the second-conductivity-type film forming chamber, the second-conductivity-type film forming chamber being connected to the first-conductivity-type film forming chamber in series,
wherein, in the step of forming the first-conductivity-type semiconductor layer, the first-conductivity-type semiconductor layer is formed on the first-principal-surface side of the semiconductor substrate that is placed in the first closed transportation path in the first-conductivity-type film forming chamber,
wherein, in the step of passing through the second-conductivity-type film forming chamber, the semiconductor substrate placed in the first closed transportation path passes through the second-conductivity-type film forming chamber, under a state in which no film is formed on the first-principal-surface side,
wherein, in the step of passing through the first-conductivity-type film forming chamber, the semiconductor substrate placed in the second closed transportation path passes through the first-conductivity-type film forming chamber, under a state in which no film is formed on the second-principal-surface side, and wherein, in the step of forming the second-conductivity-type semiconductor layer, the second-conductivity-type semiconductor layer is formed on the second-principal-surface side of the semiconductor substrate placed in the second closed transportation path in the second-conductivity-type film forming chamber.

30. The method of manufacturing a photoelectric conversion element according to claim 29, further comprising a step of moving the semiconductor substrate that has been placed in the first closed transportation path to the second closed transportation path, with the second-principal-surface side exposed, the step of moving the semiconductor substrate to the second closed transportation path being executed after the step of forming the first-conductivity-type semiconductor layer and the step of passing through the second-conductivity-type film forming chamber, wherein the step of passing through the first-conductivity-type film forming chamber and the step of forming the second-conductivity-type semiconductor layer are executed after the step of moving the semiconductor substrate to the second closed transportation path.

31. The method of manufacturing a photoelectric conversion element according to claim 29, further comprising a step of moving the semiconductor substrate that has been placed in the second closed transportation path to the first closed transportation path, with the first-principal-surface side exposed, the step of moving the semiconductor substrate to the first closed transportation path being executed after the step of passing through the first-conductivity-type film forming chamber and the step of forming the second-conductivity-type semiconductor layer, wherein the step of forming the first-conductivity-type semiconductor layer and the step of passing through the second-conductivity-type film forming chamber are executed after the step of moving the semiconductor substrate to the first closed transportation path.

32. The method of manufacturing a photoelectric conversion element according to claim 29, wherein the step of forming the first-conductivity-type semiconductor layer and the step of passing through the first-conductivity-type film forming chamber are executed in the same period.

33. The method of manufacturing a photoelectric conversion element according to claim 29, wherein the step of passing through the second-conductivity-type film forming chamber and the step of forming the second-conductivity-type semiconductor layer are executed in the same period.

* * * * *